US 12,232,308 B2

(12) United States Patent
Hirose

(10) Patent No.: US 12,232,308 B2
(45) Date of Patent: Feb. 18, 2025

(54) SEMICONDUCTOR STORAGE DEVICE

(71) Applicant: Socionext Inc., Kanagawa (JP)

(72) Inventor: Masanobu Hirose, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 437 days.

(21) Appl. No.: 17/840,079

(22) Filed: Jun. 14, 2022

(65) Prior Publication Data

US 2022/0310631 A1    Sep. 29, 2022

Related U.S. Application Data

(63) Continuation of application No. PCT/JP2020/046340, filed on Dec. 11, 2020.

(30) Foreign Application Priority Data

Dec. 19, 2019   (JP) .................. 2019-229339

(51) Int. Cl.
| | | |
|---|---|---|
| *H10B 10/00* | (2023.01) | |
| *H01L 29/06* | (2006.01) | |
| *H01L 29/423* | (2006.01) | |
| *H01L 29/786* | (2006.01) | |

(52) U.S. Cl.
CPC ....... *H10B 10/125* (2023.02); *H01L 29/0665* (2013.01); *H01L 29/42392* (2013.01); *H01L 29/78696* (2013.01)

(58) Field of Classification Search
CPC .......................... H10B 10/125; H01L 29/4239
See application file for complete search history.

(56) References Cited

U.S. PATENT DOCUMENTS

| | | | |
|---|---|---|---|
| 9,362,292 B1 | 6/2016 | Liaw | |
| 2008/0151653 A1 | 6/2008 | Ishikura et al. | |
| 2017/0162583 A1 | 6/2017 | Lee et al. | |
| 2017/0194037 A1 | 7/2017 | Fujiwara et al. | |
| 2019/0051601 A1* | 2/2019 | Hirose | ................ H01L 27/0292 |
| 2019/0165186 A1 | 5/2019 | Shimbo | |
| 2020/0243128 A1* | 7/2020 | Sato | ....................... G11C 5/025 |

FOREIGN PATENT DOCUMENTS

| | | |
|---|---|---|
| JP | 2008-176910 A | 7/2008 |
| WO | 2018/025597 A1 | 2/2018 |

OTHER PUBLICATIONS

International Search Report (ISR) dated Mar. 16, 2021 issued in International Patent Application No. PCT/JP2020/046340 with English translation.

(Continued)

*Primary Examiner* — Mounir S Amer
(74) *Attorney, Agent, or Firm* — Rimon P.C.

(57) ABSTRACT

Nanosheets 21*a* to 21*d* are formed in line in this order in the X direction, and nanosheets 21*e* to 21*h* are formed in line in this order in the X direction. Faces of the nanosheets 21*c*, 21*f*, and 21*g* on the first side as one of the opposite sides in the X direction are exposed from gate interconnects 31*c*, 31*e*, and 31*f*, respectively. Faces of the nanosheets 21*a*, 21*b*, 21*d*, 21*e*, and 21*h* on the second side as the other side in the X direction are exposed from gate interconnects 31*a* to 31*d* and 31*g*, respectively.

19 Claims, 14 Drawing Sheets

(56) References Cited

OTHER PUBLICATIONS

P. Weckx et al., "Stacked nanosheet fork architecture for SRAM design and device co-optimization toward 3nm", 2017 IEEE International Electron Devices Meeting (IEDM), Dec. 2017, IEDM17-505.

P. Weckx et al., "Novel forksheet device architecture as ultimate logic scaling device towards 2nm", 2019 IEEE International Electron Devices Meeting (IEDM), Dec. 2019, IEDM19-871~874.

* cited by examiner

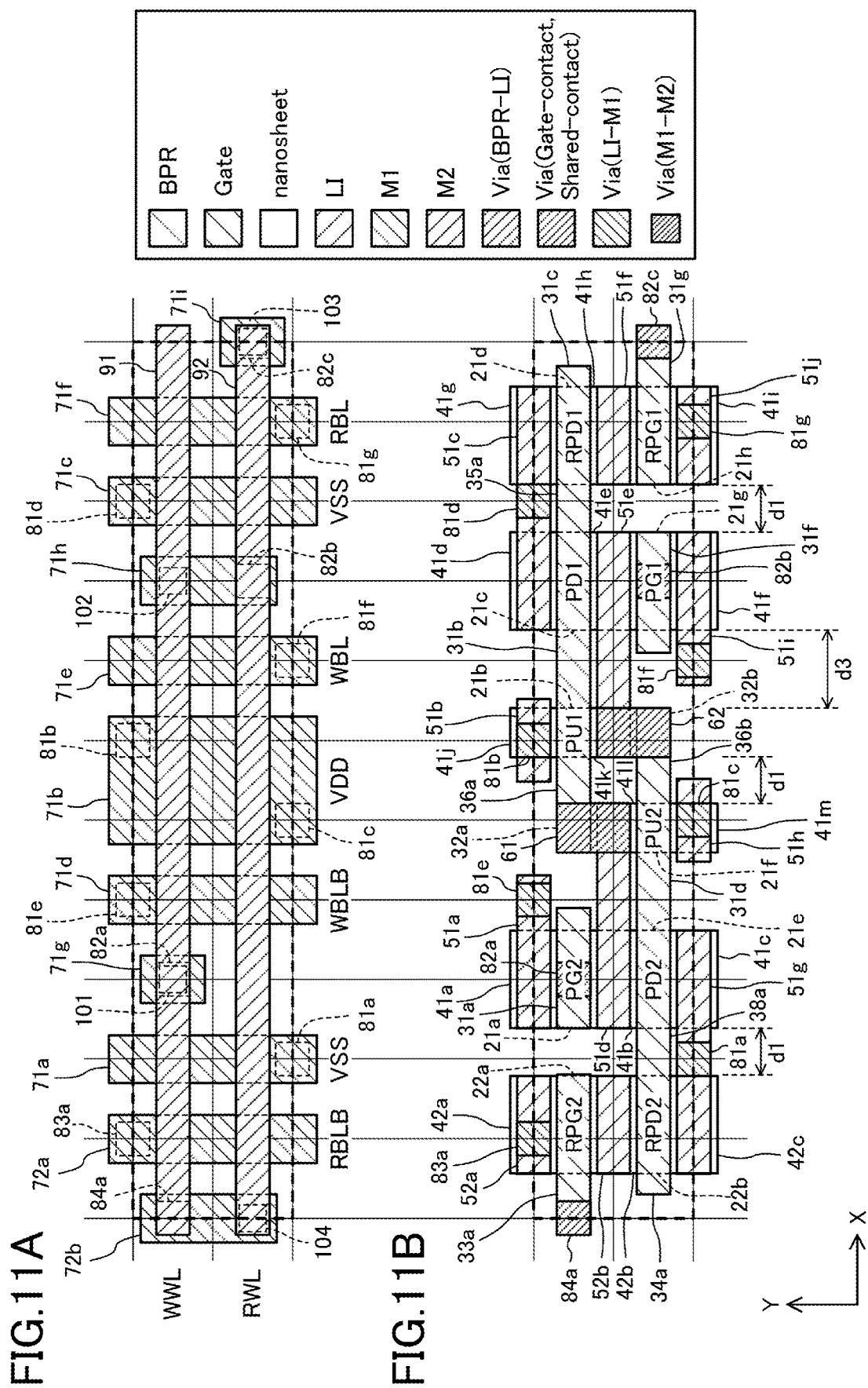

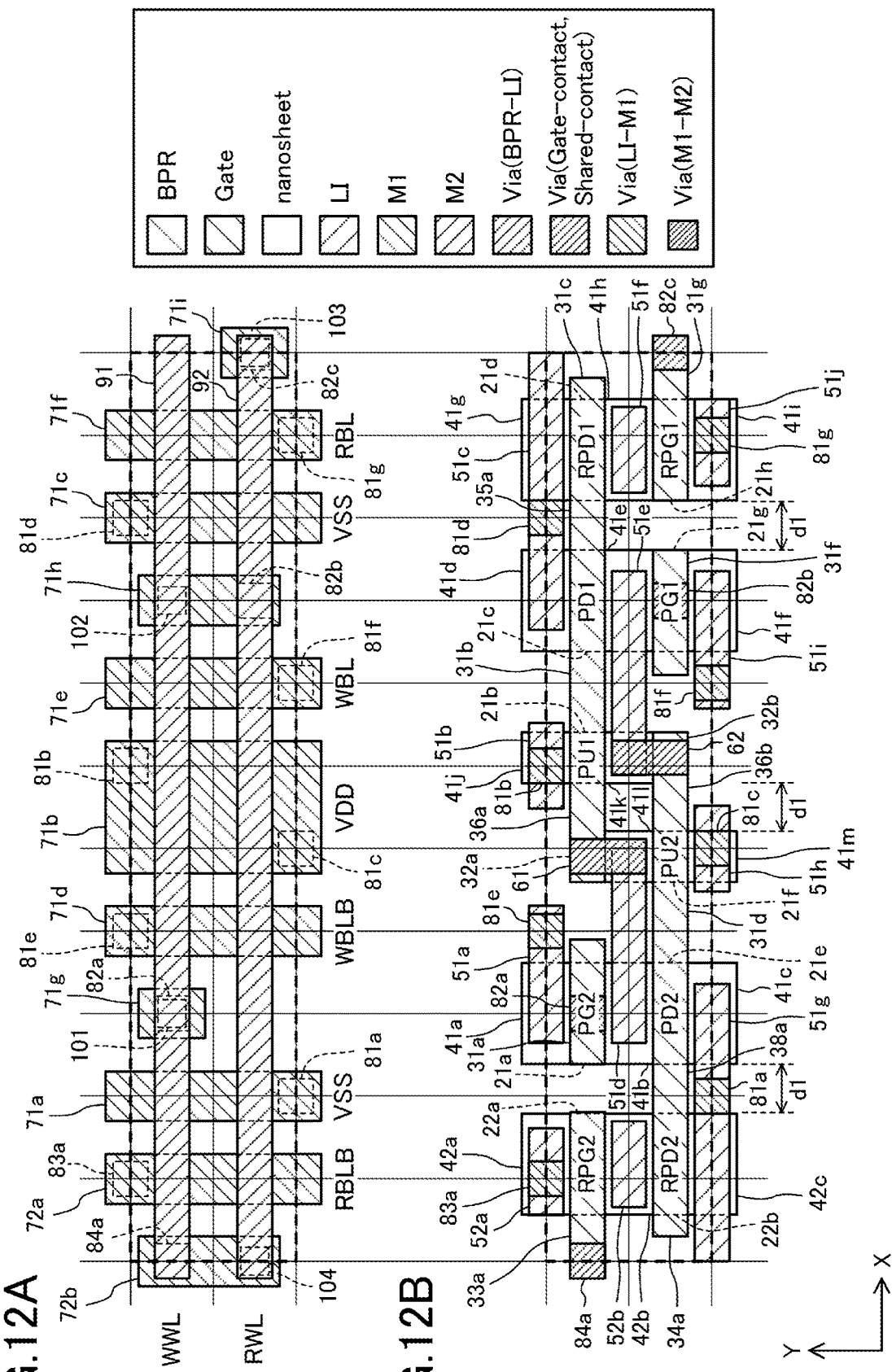

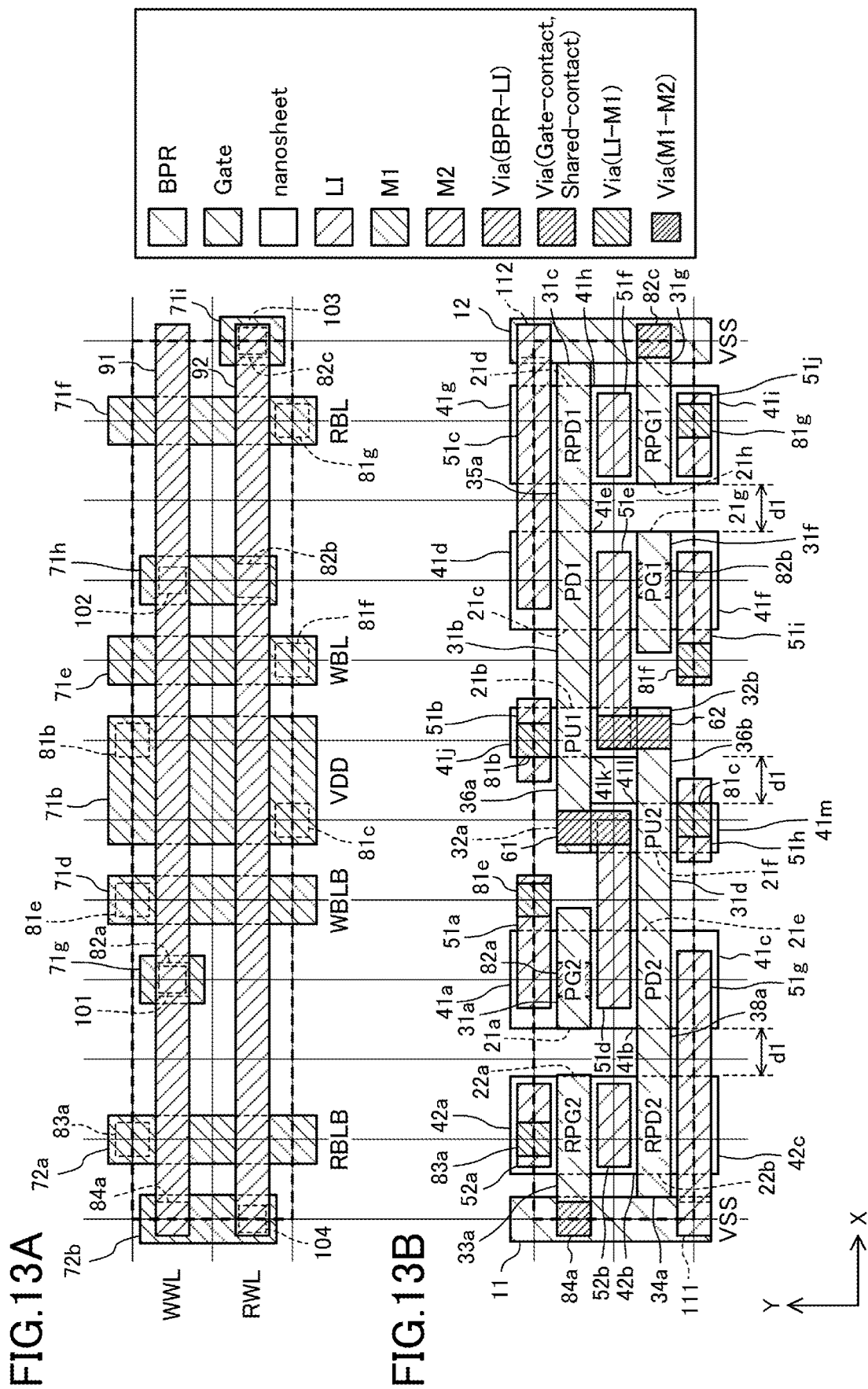

FIG.14A
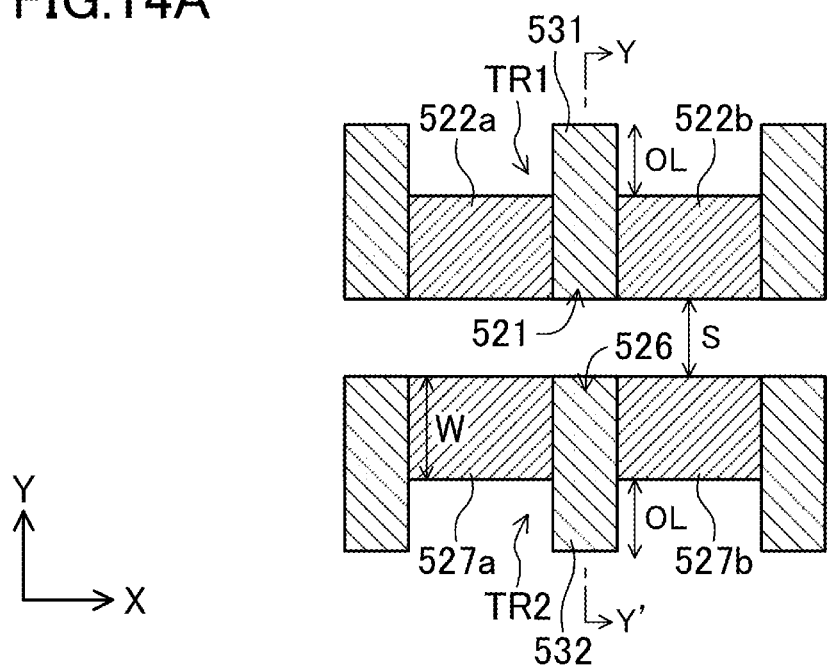
FIG.14B
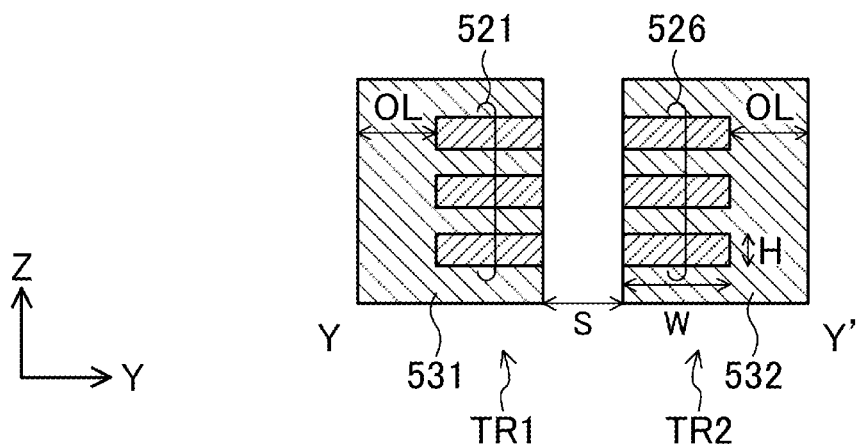
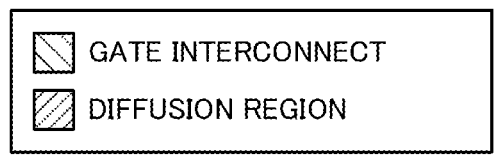

SEMICONDUCTOR STORAGE DEVICE

CROSS-REFERENCE TO RELATED APPLICATIONS

This is a continuation of International Application No. PCT/JP2020/046340 filed on Dec. 11, 2020, which claims priority to Japanese Patent Application No. 2019-229339 filed on Dec. 19, 2019. The entire disclosures of these applications are incorporated by reference herein.

BACKGROUND

The present disclosure relates to a semiconductor storage device provided with nanosheet field effect transistors (FETs), and more particularly to a layout structure of a two-port static random access memory (SRAM) cell (hereinafter simply called a cell as appropriate) using nanosheet FETs.

SRAM is widely used in semiconductor integrated circuits. As SRAM, there is a two-port SRAM having one port for write and one port for read (see U.S. Pat. No. 9,362,292 (FIG. 1), for example).

In transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet FETs (nanowire FETs) have received attention.

Among other types of nanosheet FETs, a forksheet transistor having a gate electrode shaped like a fork is proposed. P. Weckx et al., "Stacked nanosheet fork architecture for SRAM design and device co-optimization toward 3 nm," 2017 IEEE International Electron Devices Meeting (IEDM), December 2017, IEDM17-505-508 discloses a layout of an SRAM cell using forksheet transistors, whereby reduction in the area of a semiconductor storage device has been achieved.

P. Weckx et al., "Novel forksheet device architecture as ultimate logic scaling device towards 2 nm," 2019 IEEE International Electron Devices Meeting (IEDM), December 2019, IEDM19-871-874 also discloses forksheet transistors.

Note that the nanosheet FET having a fork-shaped gate electrode is hereinafter called a forksheet transistor following the prior art.

Thus far, however, no concrete examination has been made on the layout of a two-port SRAM cell using forksheet transistors.

An objective of the present disclosure is providing a layout structure of a two-port SRAM cell using forksheet transistors.

SUMMARY

According to the first mode of the present disclosure, in a semiconductor storage device including a two-port SRAM cell, the two-port SRAM cell includes: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to the first node at one of its nodes, to a second power supply supplying a second voltage different from the first voltage at the other node, and to the second node at its gate; a fourth transistor connected to the second node at one of its nodes, to the second power supply at the other node, and to the first node at its gate; a fifth transistor connected to a first write bit line at one of its nodes, to the first node at the other node, and to a write word line at its gate; a sixth transistor connected to a second write bit line at one of its nodes, to the second node at the other node, and to the write word line at its gate, the first write bit line and the second write bit line constituting a complementary bit line pair; a seventh transistor connected to the second power supply at one of its nodes and to the second node at its gate; and an eighth transistor connected to the other node of the seventh transistor at one of its nodes, to a first read bit line at the other node, and to a read word line at its gate, wherein the first to eighth transistors respectively include first to eighth nanosheets extending in a first direction, and first to eighth gate interconnects surrounding the first to eighth nanosheets in a second direction vertical to the first direction and in a third direction perpendicular to the first and second directions, the sixth, first, third, and seventh nanosheets are formed in line in this order in the second direction, the fourth, second, fifth, and eighth nanosheets are formed in line in this order in the second direction, faces of the second, third, and fifth nanosheets on a first side as one of the opposite sides in the second direction are exposed from the second, third, and fifth gate interconnects, respectively, faces of the first, fourth, sixth, seventh, and eighth nanosheets on a second side as the other side in the second direction are exposed from the first, fourth, sixth, seventh, and eighth gate interconnects, respectively, the first side is the side on which the third nanosheet is opposed to the first nanosheet, and also the side on which the second nanosheet is opposed to the fourth nanosheet, and the second side is the side on which the first nanosheet is opposed to the third nanosheet, and also the side on which the fourth nanosheet is opposed to the second nanosheet.

According to the above mode, the first to eighth transistors include the first to eighth nanosheets and the first to eighth gate interconnects, respectively. The first to eighth gate interconnects surround the first to eighth nanosheets, respectively, in the second and third directions. Faces of the second, third, and fifth nanosheets on the first side, which is one of the opposite sides in the second direction, are exposed from the second, third, and fifth gate interconnects, respectively. Faces of the first, fourth, sixth, seventh, and eighth nanosheets on the second side, which is the other side in the second direction, are exposed from the first, fourth, sixth, seventh, and eighth gate interconnects, respectively. That is, the first to eighth transistors are each constituted by a forksheet transistor. With the first to eighth transistors, therefore, a two-port SRAM cell using forksheet transistors can be implemented.

Also, the first and third nanosheets are formed side by side in the second direction, and the second and fourth nanosheets are formed side by side in the second direction. The first side is the side on which the third nanosheet is opposed to the first nanosheet, and also the side on which the second nanosheet is opposed to the fourth nanosheet. The second side is the side on which the first nanosheet is opposed to the third nanosheet, and also the side on which the fourth nanosheet is opposed to the second nanosheet. That is, the faces of the first and third nanosheets opposed to each other are exposed from the first and third gate interconnects, respectively. The faces of the second and fourth nanosheets opposed to each other are exposed from the second and fourth gate interconnects, respectively. This can reduce the distance between the first and third transistors in the second direction and the distance between the second and fourth transistors in the second direction, and thus achieve reduction in the area of the semiconductor storage device.

Thus, in addition to implementing a two-port SRAM cell using forksheet transistors, it is possible to achieve reduction in the area of the semiconductor storage device.

According to the second mode of the present disclosure, in a semiconductor storage device including a two-port SRAM cells, the two-port SRAM cell includes: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to the first node at one of its nodes, to a second power supply supplying a second voltage different from the first voltage at the other node, and to the second node at its gate; a fourth transistor connected to the second node at one of its nodes, to the second power supply at the other node, and to the first node at its gate; a fifth transistor connected to a first write bit line at one of its nodes, to the first node at the other node, and to a write word line at its gate; a sixth transistor connected to a second write bit line at one of its nodes, to the second node at the other node, and to the write word line at its gate, the first write bit line and the second write bit line constituting a complementary bit line pair; a seventh transistor connected to the second power supply at one of its nodes and to the second node at its gate; and an eighth transistor connected to the other node of the seventh transistor at one of its nodes, to a first read bit line at the other node, and to a read word line at its gate, wherein the first to eighth transistors respectively include first to eighth nanosheets extending in a first direction, and first to eighth gate interconnects surrounding the first to eighth nanosheets in a second direction vertical to the first direction and in a third direction perpendicular to the first and second directions, the sixth, first, third, and seventh nanosheets are formed in line in this order in the second direction, the fourth, second, fifth, and eighth nanosheets are formed in line in this order in the second direction, faces of the second, third, and fifth nanosheets on a first side as one of the opposite sides in the second direction are exposed from the second, third, and fifth gate interconnects, respectively, faces of the first, fourth, sixth, seventh, and eighth nanosheets on a second side as the other side in the second direction are exposed from the first, fourth, sixth, seventh, and eighth gate interconnects, respectively, the first side is the side on which the third nanosheet is opposed to the seventh nanosheet, and also the side on which the fifth nanosheet is opposed to the eighth nanosheet, and the second side is the side on which the seventh nanosheet is opposed to the third nanosheet, and also the side on which the eighth nanosheet is opposed to the fifth nanosheet.

According to the above mode, the first to eighth transistors include the first to eighth nanosheets and the first to eighth gate interconnects, respectively. The first to eighth gate interconnects surround the first to eighth nanosheets, respectively, in the second and third directions. Faces of the second, third, and fifth nanosheets on the first side, which is one of the opposite sides in the second direction, are exposed from the second, third, and fifth gate interconnects, respectively. Faces of the first, fourth, sixth, seventh, and eighth nanosheets on the second side, which is the other side in the second direction, are exposed from the first, fourth, sixth, seventh, and eighth gate interconnects, respectively. That is, the first to eighth transistors are each constituted by a forksheet transistor. With the first to eighth transistors, therefore, a two-port SRAM cell using forksheet transistors can be implemented.

Also, the third and seventh nanosheets are formed side by side in the second direction, and the fifth and eighth nanosheets are formed side by side in the second direction. The first side is the side on which the third nanosheet is opposed to the seventh nanosheet, and also the side on which the fifth nanosheet is opposed to the eighth nanosheet. The second side is the side on which the seventh nanosheet is opposed to the third nanosheet, and also the side on which the eighth nanosheet is opposed to the fifth nanosheet. That is, the faces of the third and seventh nanosheets opposed to each other are exposed from the third and seventh gate interconnects, respectively. The faces of the fifth and eighth nanosheets opposed to each other are exposed from the fifth and eighth gate interconnects, respectively. This can reduce the distance between the third and seventh transistors in the second direction and the distance between the fifth and eighth transistors in the second direction, and thus achieve reduction in the area of the semiconductor storage device.

Thus, in addition to implementing a two-port SRAM cell using forksheet transistors, it is possible to achieve reduction in the area of the semiconductor storage device.

According to the present disclosure, a two-port SRAM cell using forksheet transistors can be implemented, and also reduction in the area of a semiconductor storage device can be achieved.

BRIEF DESCRIPTION OF THE DRAWINGS

FIGS. 11A-11B are plan views showing another example of the layout structure of the two-port SRAM cell according to the second embodiment.

FIGS. 12A-12B are plan views showing yet another example of the layout structure of the two-port SRAM cell according to the second embodiment.

FIGS. 13A-13B are plan views showing still yet another example of the layout structure of the two-port SRAM cell according to the second embodiment.

FIGS. 14A-14B are views showing a basic structure of a forksheet FET.

DETAILED DESCRIPTION

Figure 1:
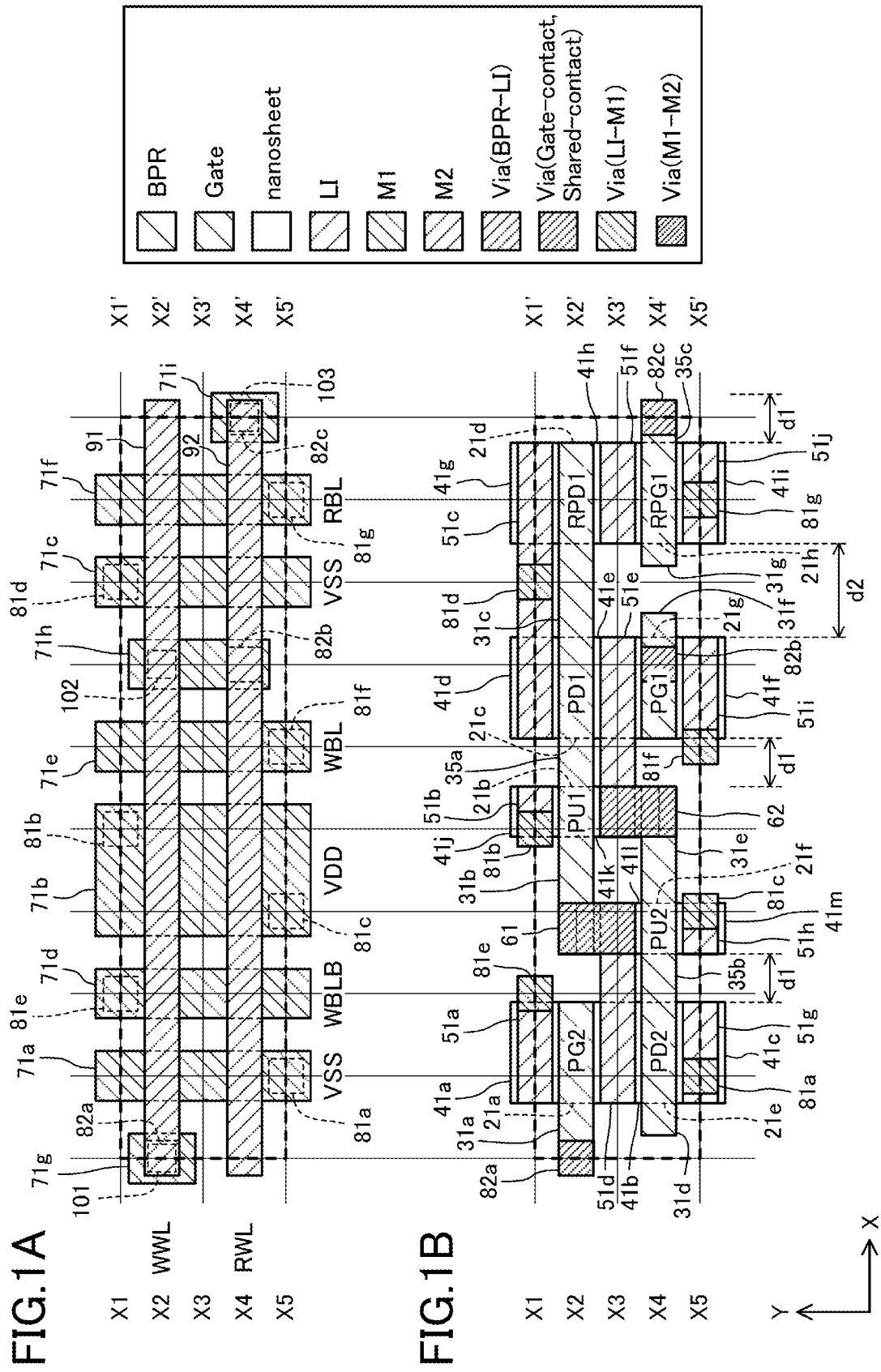
FIGS. 1A-1B are plan views showing an example of the layout structure of a two-port SRAM cell according to the first embodiment.

Embodiments of the present disclosure will be described hereinafter with reference to the accompanying drawings. In the following embodiments, it is assumed that the semiconductor storage device includes a plurality of SRAM cells (hereinafter simply called cells as appropriate), and at least some of the SRAM cells include forksheet transistors each having a fork-shaped gate electrode, among nanosheet FETs (nanowire FETs). The nanosheet FET is a FET using a thin sheet (nanosheet) through which a current flows. Such a nanosheet is formed of silicon, for example. In the semiconductor storage device, it is assumed that some of the nanosheet FETs are forksheet FETs.

In the present disclosure, a semiconductor layer portion formed on each end of a nanosheet to constitute a terminal that is to be the source or drain of a nanosheet FET is called a "pad." Also, hereinafter, in the plan views such as FIGS. 1A-1B, the vertical direction in the figure is called a Y direction (corresponding to the first direction), the horizontal direction in the figure is called an X direction (corresponding to the second direction), and the direction perpendicular to the substrate plane is called a Z direction (corresponding to the third direction).

Structure of Forksheet

FIGS. 14A-14B are views showing a basic structure of a forksheet FET, where FIG. 14A is a plan view and FIG. 14B is a cross-sectional view taken along line Y-Y' in FIG. 14A. In the basic structure of FIGS. 14A-14B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 14A-14B, the channel portions 521 and 526 are each constituted by a stacked structure of three nanosheets coinciding with one another as viewed in plan. Pads 522a and 522b that are to be the source and drain regions of the transistor TR1 are formed on both sides of the channel portion 521 in the X direction. Pads 527a and 527b that are to be the source and drain regions of the transistor TR2 are formed on both sides of the channel portion 526 in the X direction. The pads 522a and 522b are formed by epitaxial growth from the nanosheets constituting the channel portion 521. The pads 527a and 527b are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 14B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via a gate insulating film (not shown). Note however that the faces of the nanosheets constituting the channel portion 526 on the side closer to the transistor TR1 in the Y direction are exposed, not covered with the gate interconnect 532. That is, in the cross-sectional view of FIG. 14B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 14A-14B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 14B, it is not limited to this. For example, the shape may be square, circular, or oval.

The semiconductor storage device may include both forksheet FETs and nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations.

In the plan views and the cross-sectional views in the following embodiments, illustration of various insulating films may be omitted. Also, nanosheets and pads on both ends of the nanosheets may be illustrated in simplified linear shapes.

The source and drain of a transistor are herein called the "nodes" of the transistor as appropriate. That is, one node of a transistor refers to the source or drain of the transistor, and both nodes of a transistor refer to the source and drain of the transistor.

In the following embodiments and alterations, like components are denoted by the same reference characters and description thereof may be omitted.

First Embodiment

Figure 2:
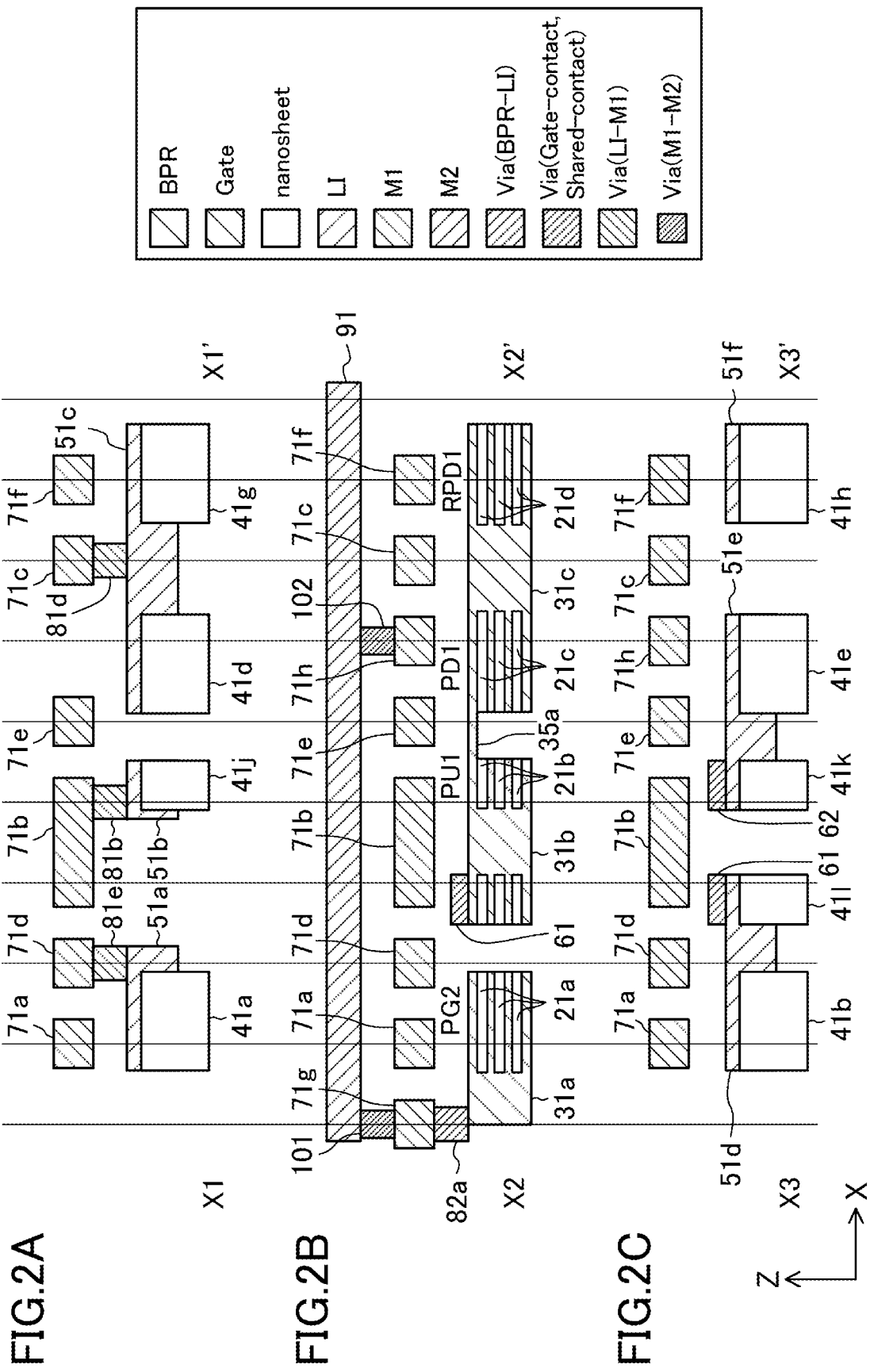
FIGS. 2A-2C are cross-sectional views showing the layout structure of the two-port SRAM cell according to the first embodiment.
Figure 3:
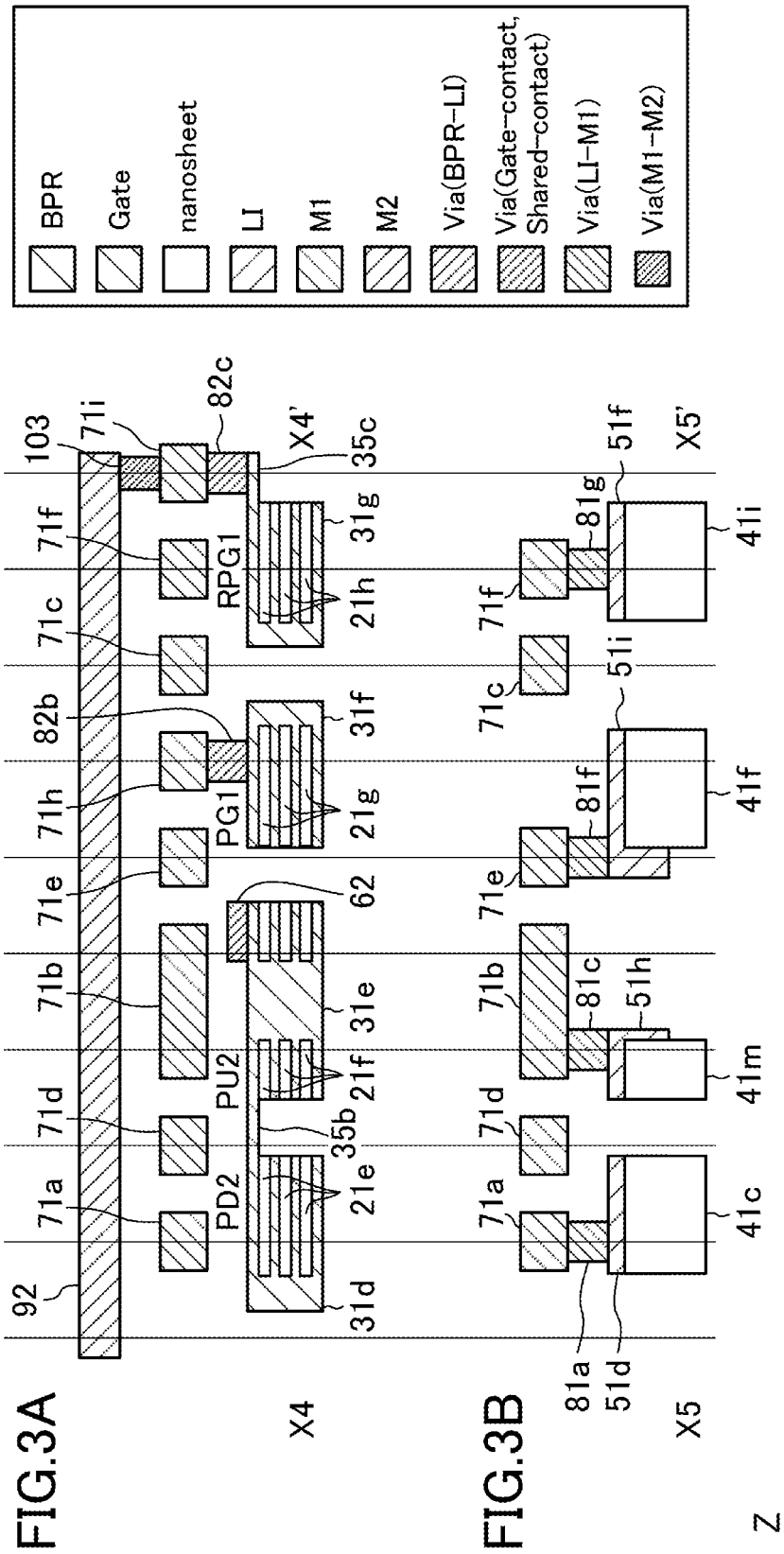
FIGS. 3A-3B are cross-sectional views showing the layout structure of the two-port SRAM cell according to the first embodiment.

FIGS. 1A-1B to FIGS. 3A-3B are views showing an example of the layout structure of a two-port SRAM cell according to the first embodiment, where FIGS. 1A and 1B are plan views, and FIGS. 2A to 2C, 3A, and 3B are cross-sectional views taken in the horizontal direction as viewed in plan. Specifically, FIG. 1A shows an upper part of the cell including M1 and M2 interconnect layers, and FIG. 1B shows a lower part of the cell that is lower than the M1 and M2 interconnect layers and includes nanosheet FETs. FIG. 2A shows a cross section taken along line X1-X1', FIG. 2B shows a cross section taken along line X2-X2', FIG. 2C shows a cross section taken along line X3-X3', FIG. 3A shows a cross section taken along line X4-X4', and FIG. 3B shows a cross section taken along line X5-X5'.

Figure 4:
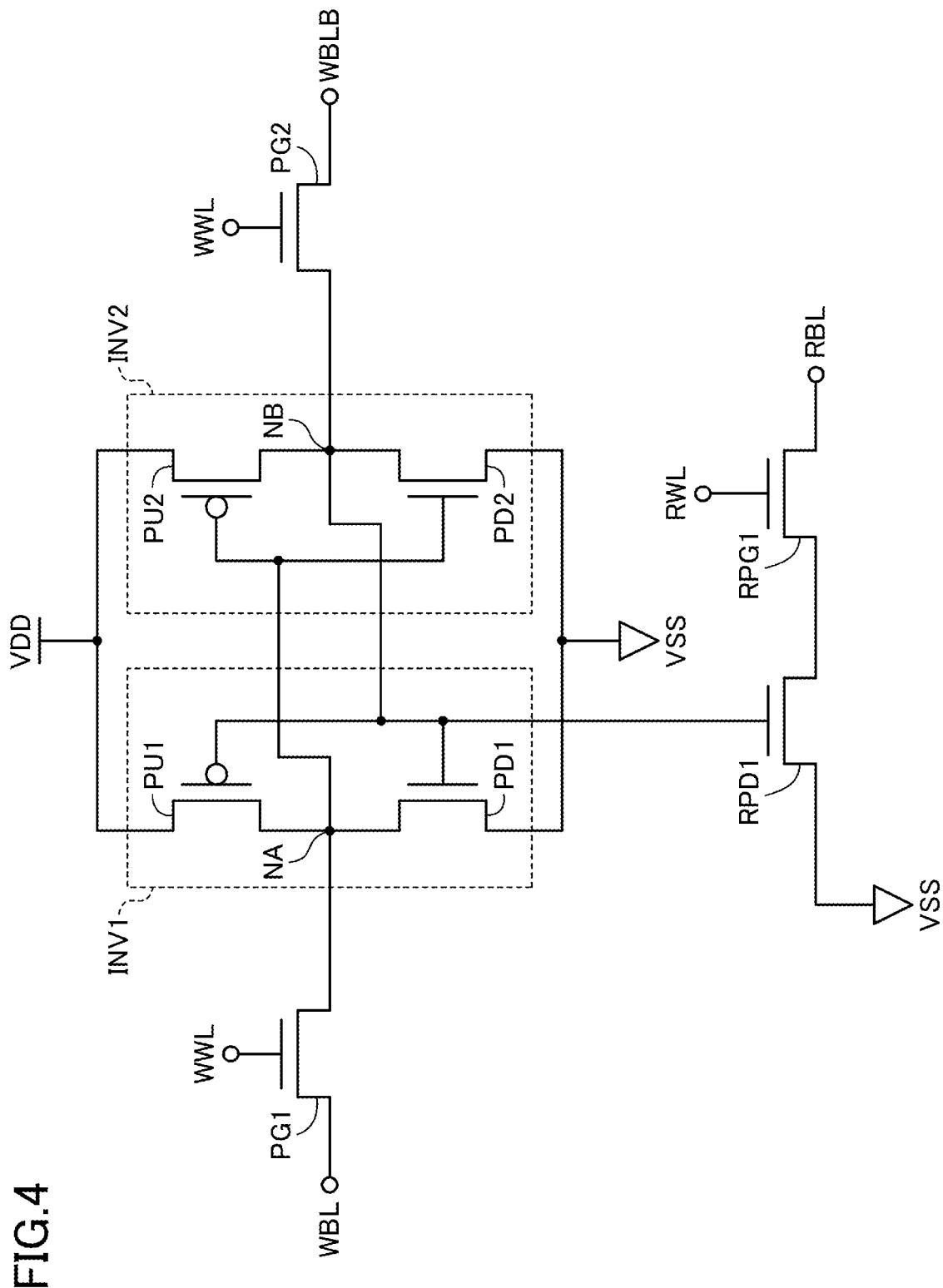
FIG. 4 is a circuit diagram showing a configuration of the two-port SRAM cell according to the first embodiment.

FIG. 4 is a circuit diagram showing a configuration of the two-port SRAM cell according to the first embodiment. As shown in FIG. 4, the two-port SRAM cell constitutes a two-port SRAM circuit including load transistors PU1 and PU2, drive transistors PD1 and PD2, access transistors PG1 and PG2, a read drive transistor RPD1, and a read access transistor RPG1. The load transistors PU1 and PU2 are p-type FETs, and the drive transistors PD1 and PD2, the access transistors PG1 and PG2, the read drive transistor RPD1, and the read access transistor RPG1 are n-type FETs.

The load transistor PU1 is provided between a power supply VDD and a first node NA, and the drive transistor PD1 is provided between the first node NA and a power supply VSS. The gates of the load transistor PU1 and the drive transistor PD1 are connected to a second node NB, thereby constituting an inverter INV1. The load transistor PU2 is provided between the power supply VDD and the second node NB, and the drive transistor PD2 is provided between the second node NB and the power supply VSS. The gates of the load transistor PU2 and the drive transistor PD2 are connected to the first node NA, thereby constituting an inverter INV2. That is, the output of one of the inverters is connected to the input of the other inverter, whereby a latch is formed.

The access transistor PG1 is provided between a write bit line WBL and the first node NA, and its gate is connected to a write word line WWL. The access transistor PG2 is provided between a write bit line WBLB and the second node NB, and its gate is connected to the write word line WWL. The write bit lines WBL and WBLB constitute a complementary write bit line pair.

The read drive transistor RPD1 is connected to the power supply VSS at its source, to the second node NB at its gate, and to the source of the read access transistor RPG1 at its drain. The read access transistor RPG1 is connected to a read word line RWL at its gate and to a read bit line RBL at its drain.

In the two-port SRAM circuit, when the write bit lines WBL and WBLB constituting the complementary write bit line pair are driven to HIGH level and LOW level, respectively, and the write word line WWL is driven to HIGH level, HIGH level is written into the first node NA and LOW level is written into the second node NB. By contrast, when the write bit lines WBL and WBLB are driven to LOW level and HIGH level, respectively, and the write word line WWL is driven to HIGH level, LOW level is written into the first node NA and HIGH level is written into the second node NB. In such a state where the first and second nodes NA and NB have written data, when the write word line WWL is driven to LOW level, a latched state is established, whereby the data written in the first and second nodes NA and NB are retained.

Also, when the read bit line RBL is precharged to HIGH level in advance and the read word line RWL is driven to HIGH level, the state of the read bit line RBL is established depending on the data written in the second node NB, whereby read of data from the SRAM cell can be performed. Specifically, when the second node NB is in HIGH level, the read bit line RBL is discharged to LOW level. By contrast, when the second node NB is in LOW level, the read bit line RBL retains HIGH level.

As described above, the two-port SRAM cell is provided with functions of data write into the SRAM cell, data retention, and data read from the SRAM cell by controlling the write bit lines WBL and WBLB, the read bit line RBL, the write word line WWL, and the read word line RWL.

In the following description, the solid lines running horizontally and vertically in the plan views such as FIGS. 1A-1B and the solid lines running vertically in the cross-sectional views such as FIGS. 2A-2C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

The dashed line drawn to surround a cell in the plan views such as FIGS. 1A-1B defines the bounds of the two-port SRAM cell (the outer rim of the two-port SRAM cell). The two-port SRAM cell is placed so that its rim touches a rim of a cell adjacent in the X direction or the Y direction.

In the plan views such as FIGS. 1A-1B, an inverted one of the two-port SRAM cell in the X direction is placed on each side of the two-port SRAM cell in the X direction, and an inverted one of the two-port SRAM cell in the Y direction is placed on each side of the two-port SRAM cell in the Y direction.

As shown in FIG. 1B, nanosheets $21a$ to $21h$ extending in the X and Y directions are formed on a substrate. The nanosheets $21a$ to $21d$ are arranged in this order in the X direction, and the nanosheets $21e$ to $21h$ are arranged in this order in the X direction. Also, the nanosheets $21a$, $21c$, and $21d$ are formed side by side with the nanosheets $21e$, $21g$, and $21h$, respectively, in the Y direction.

The width of the nanosheets $21a$, $21c$, $21d$, $21e$, $21g$, and $21h$ in the X direction is double the width of the nanosheets $21b$ and $21f$ in the X direction.

The nanosheets $21d$ and $21h$ are formed adjacent to the cell boundary on the right side in the figure, and the nanosheets $21a$ and $21e$ are formed adjacent to the cell boundary on the left side in the figure.

The nanosheets $21a$ to $21h$ constitute the channel portions of the access transistor PG2, the load transistor PU1, the drive transistor PD1, the read drive transistor RPD1, the drive transistor PD2, the load transistor PU2, the access transistor PG1, and the read access transistor RPG1, respectively.

Gate interconnects (gates) 31a to 31g extend in the X and Z directions. The gate interconnects 31a to 31c are arranged in the X direction, and the gate interconnects 31d to 31g are arranged in the X direction.

The gate interconnect 31a overlaps the nanosheets 21a as viewed in plan, the gate interconnect 31b overlaps the nanosheets 21b as viewed in plan, the gate interconnect 31c overlaps the nanosheets 21c and 21d as viewed in plan, the gate interconnect 31d overlaps the nanosheets 21e as viewed in plan, the gate interconnect 31e overlaps the nanosheets 21f as viewed in plan, the gate interconnect 31f overlaps the nanosheets 21g as viewed in plan, and the gate interconnect 31g overlaps the nanosheets 21h as viewed in plan.

The gate interconnect 31a is to be the gate of the access transistor PG2, the gate interconnect 31b is to be the gate of the load transistor PU1, the gate interconnect 31c is to be the gates of the drive transistor PD1 and the read drive transistor RPD1, the gate interconnect 31d is to be the gate of the load transistor PD2, the gate interconnect 31e is to be the gate of the load transistor PU2, the gate interconnect 31f is to be the gate of the access transistor PG1, and the gate interconnect 31g is to be the gate of the read access transistor RPG1.

The gate interconnects 31b and 31c are mutually connected through a bridge 35a extending in the X direction. The gate interconnects 31d and 31e are mutually connected through a bridge 35b extending in the X direction. The gate interconnect 31g is connected with a gate interconnect 31g of a two-port SRAM cell placed on the right side of the subject two-port SRAM cell in the figure through a bridge 35c extending in the X direction.

Pads 41a to 41i doped with an n-type semiconductor are formed at the upper end of the nanosheets 21a, between the nanosheets 21a and 21e, at the lower end of the nanosheets 21e, at the upper end of the nanosheets 21c, between the nanosheets 21c and 21g, at the lower end of the nanosheets 21g, at the upper end of the nanosheets 21d, between the nanosheets 21d and 21h, and at the lower end of the nanosheets 21h, respectively, as viewed in the figure. The pads 41a and 41b constitute the nodes of the access transistor PG2, the pads 41b and 41c constitute the nodes of the drive transistor PD2, the pads 41d and 41e constitute the nodes of the drive transistor PD1, the pads 41e and 41f constitute the nodes of the access transistor PG1, the pads 41g and 41h constitute the nodes of the read drive transistor RPD1, and the pads 41h and 41i constitute the nodes of the read access transistor PRG1.

That is, the access transistor PG2 is constituted by the nanosheets 21a, the gate interconnect 31a, and the pads 41a and 41b. The drive transistor PD1 is constituted by the nanosheets 21c, the gate interconnect 31c, and the pads 41d and 41e. The read drive transistor RPD1 is constituted by the nanosheets 21d, the gate interconnect 31c, and the pads 41g and 41h. The drive transistor PD2 is constituted by the nanosheets 21e, the gate interconnect 31d, and the pads 41b and 41c. The access transistor PG1 is constituted by the nanosheets 21g, the gate interconnect 31f, and the pads 41e and 41f. The read access transistor RPG1 is constituted by the nanosheets 21h, the gate interconnect 31g, and the pads 41h and 41i.

Pads 41j to 41m doped with a p-type semiconductor are formed at the upper end of the nanosheets 21b, at the lower end of the nanosheets 21b, at the upper end of the nanosheets 21f, and at the lower end of the nanosheets 21f, respectively, as viewed in the figure. The pads 41j and 41k constitute the nodes of the load transistor PU1, and the pads 41l and 41m constitute the nodes of the load transistor PU2.

That is, the load transistor PU1 is constituted by the nanosheets 21b, the gate interconnect 31b, and the pads 41j and 41k. The load transistor PU2 is constituted by the nanosheets 21f, the gate interconnect 31e, and the pads 41l and 41m.

Thus, the access transistor PG2, the load transistor PU1, the drive transistor PD1, and the read drive transistor RPD1 are formed in line in the X direction. The drive transistor PD2, the load transistor PU2, the access transistor PG1, and the read access transistor RPG1 are formed in line in the X direction. Also, the access transistor PG2 and the drive transistor PD2 are formed side by side in the Y direction, the drive transistor PD1 and the access transistor PG1 are formed side by side in the Y direction, and the read drive transistor RPD1 and the read access transistor RPG1 are formed side by side in the Y direction.

In a local interconnect layer, local interconnects (LI) 51a to 51j extending in the X direction are formed. The local interconnect 51a is connected with the pad 41a, the local interconnect 51b is connected with the pad 41j, the local interconnect 51c is connected with the pads 41d and 41g, the local interconnect 51d is connected with the pads 41b and 41l, the local interconnect 51e is connected with the pads 41k and 41e, the local interconnect 51f is connected with the pad 41h, the local interconnect 51g is connected with the pad 41c, the local interconnect 51h is connected with the pad 41m, the local interconnect 51i is connected with the pad 41f, and the local interconnect 51j is connected with the pad 41i.

Also, the local interconnect 51d is connected with the gate interconnect 31b through a shared contact 61, and the local interconnect 51e is connected with the gate interconnect 31e through a shared contact 62. The gate interconnects 31d and 31e, the bridge 35b, the local interconnect 51e, and the shared contact 62 correspond to the first node NA. The gate interconnects 31b and 31c, the bridge 35a, the local interconnect 51d, and the shared contact 61 correspond to the second node NB.

As shown in FIG. 1A, in the M1 interconnect layer, formed are interconnects 71a to 71f extending in the Y direction across the cell from the upper to lower ends in the figure. Also, interconnects 71g to 71i are formed. The interconnects 71a and 71c supply the power supply voltage VSS, and the interconnect 71b supplies the power supply voltage VDD. The interconnects 71d to 71f correspond to the write bit lines WBLB and WBL and the read bit line RBL, respectively.

The interconnect 71a is connected with the local interconnect 51g through a contact (via) 81a. The interconnect 71b is connected with the local interconnect 51b through a contact 81b and also connected with the local interconnect 51h through a contact 81c. The interconnect 71c is connected with the local interconnect 51c through a contact 81d, the interconnect 71d is connected with the local interconnect 51a through a contact 81e, the interconnect 71e is connected with the local interconnect 51i through a contact 81f, and the interconnect 71f is connected with the local interconnect 51j through a contact 81g.

The interconnect 71g is connected with the gate interconnect 31a through a contact (gate contact) 82a. The interconnect 71h is connected with the gate interconnect 31f through a contact 82b. The interconnect 71i is connected with the gate interconnect 31g through a contact 82c and the bridge 35c.

In the M2 interconnect layer above the M1 interconnect layer, formed are interconnects 91 and 92 extending in the X direction across the cell from the left to right ends in the figure. The interconnect 91 corresponds to the write word line WWL, and the interconnect 92 corresponds to the read word line RWL.

The interconnect 91 is connected with the interconnect 71g through a contact 101 and also connected with the interconnect 71h through a contact 102. The interconnect 92 is connected with the interconnect 71i through a contact 103.

As shown in FIGS. 2B and 3A, the nanosheets 21a to 21h are each constituted by three sheet-like semiconductors (nanosheets). The nanosheets of each of the nanosheets 21a to 21h are stacked on top of one another with space between them in the Z direction. That is, each of the nanosheet FETs included in the two-port SRAM according to this embodiment includes three nanosheets.

The peripheries of the nanosheets 21a to 21h in the X and Z directions are surrounded by the gate interconnects. Note however that portions of the peripheries of the nanosheets 21a to 21h in the X and Z directions are exposed, not covered by the gate interconnects.

More specifically, the right side faces of the nanosheets 21a, 21b, 21d, 21e, and 21h are exposed, not covered with the gate interconnects 31a, 31b, 31c, 31d, and 31g, respectively. The left side faces of the nanosheets 21c, 21f, and 21g are exposed, not covered with the gate interconnects 31c, 31e, and 31f, respectively.

That is, the faces of the nanosheets 21b and 21c opposed to each other in the X direction are exposed from the gate interconnects 31b and 31c, respectively. The faces of the nanosheets 21e and 21f opposed to each other in the X direction are exposed from the gate interconnects 31d and 31e, respectively. With this configuration, a distance d1 between the load transistor PU1 and the drive transistor PD1, and between the drive transistor PD2 and the load transistor PU2, in the X direction can be made smaller than a distance between other transistors adjacent to each other in the X direction (e.g., a distance d2 between the drive transistor PD1 and the read drive transistor RPD1 in the X direction).

Also, the nanosheets 21d and 21h are formed adjacent to the cell boundary on the right side in the figure, and the right side faces of the nanosheets 21d and 21h in the figure are exposed from the gate interconnects 31c and 31g, respectively. A two-port SRAM cell inverted in the X direction is placed on the right side of the two-port SRAM cell in FIGS. 1A-1B. That is, in the two-port SRAM cells arranged side by side in the X direction, the faces of the nanosheets 21d of these cells opposed to each other are exposed from the gate interconnects 31c, and the faces of the nanosheets 21h of these cells opposed to each other are exposed from the gate interconnects 31g. With this configuration, the distance d1 between the read drive transistors RPD1 of these cells, and between the read access transistors RPG1 of these cells, in the X direction can be made smaller than a distance between other transistors adjacent to each other in the X direction (e.g., the distance d2 between the drive transistor PD1 and the read drive transistor RPD1 in the X direction).

Having the configuration described above, in the load transistor PU1, the pad 41j is connected to the interconnect 71b supplying VDD, the pad 41k is connected to the local interconnect 51e (the first node NA), and the gate interconnect 31b is connected to the shared contact 61 (the second node NB). In the load transistor PU2, the pad 41m is connected to the interconnect 71b supplying VDD, the pad 41l is connected to the local interconnect 51d (the second node NB), and the gate interconnect 31e is connected to the shared contact 62 (the first node NA). In the drive transistor PD1, the pad 41e is connected to the local interconnect 51e (the first node NA), the pad 41d is connected to the interconnect 71c supplying VSS, and the gate interconnect 31c is connected to the shared contact 61 (the second node NB). In the drive transistor PD2, the pad 41b is connected to the local interconnect 51d (the second node NB), the pad 41c is connected to the interconnect 71a supplying VSS, and the gate interconnect 31d is connected to the shared contact 62 (the first node NA). In the access transistor PG1, the pad 41f is connected to the interconnect 71e (the write bit line WBL), the pad 41e is connected to the local interconnect 51e (the first node NA), and the gate interconnect 31f is connected to the interconnect 91 (the write word line WWL). In the access transistor PG2, the pad 41a is connected to the interconnect 71d (the write bit line WBLB), the pad 41b is connected to the local interconnect 51d (the second node NB), and the gate interconnect 31a is connected to the interconnect 91 (the write word line WWL). In the read drive transistor RPD1, the pad 41g is connected to the interconnect 71c supplying VSS and the gate interconnect 31c is connected to the shared contact 61 (the second node NB). In the read access transistor RPG1, the pad 41i is connected to the interconnect 71f (the read bit line RBL) and the gate interconnect 31g is connected to the interconnect 92 (the read word line RWL). The read drive transistor RPD1 and the read access transistor RPG1 share the pad 41h.

The load transistors PU1 and PU2, the drive transistors PD1 and PD2, the access transistors PG1 and PG2, the read drive transistor RPD1, and the read access transistor RPG1 include the nanosheets 21b, 21f, 21c, 21e, 21g, 21a, 21d, and 21h extending in the Y direction and the gate interconnects 31b, 31e, 31c, 31d, 31f, 31a, 31c, and 31g, respectively. The nanosheets 21a to 21d are formed in line in this order in the X direction, and the nanosheets 21e to 21h are formed in line in this order in the X direction. The gate interconnects 31a, 31b, and 31d to 31g surround the peripheries of the nanosheets 21a, 21b, and 21e to 21h, respectively, in the X and Z directions. The gate interconnect 31c surrounds the peripheries of the nanosheets 21c and 21d in the X and Z directions. The left side faces of the nanosheets 21c, 21f, and 21g in the X direction in the figure are exposed from the gate interconnects 31c, 31e, and 31f, respectively. The right side faces of the nanosheets 21a, 21b, 21d, 21e, and 21h in the X direction in the figure are exposed from the gate interconnects 31a to 31d and 31g, respectively.

That is, the load transistors PU1 and PU2, the drive transistors PD1 and PD2, the access transistors PG1 and PG2, the read drive transistor RPD1, and the read access transistor RPG1 are each constituted by a forksheet transistor. In this way, a two-port SRAM cell using forksheet transistors is implemented.

Also, the faces of the nanosheets 21b and 21c opposed to each other are exposed from the gate interconnects 31b and 31c, respectively. The faces of the nanosheets 21e and 21f opposed to each other are exposed from the gate interconnects 31d and 31e, respectively. This can reduce the distance d1 between the load transistor PU1 and the drive transistor PD1, and between the drive transistor PD2 and the load transistor PU2, in the X direction, whereby reduction in the area of the semiconductor storage device can be achieved.

Thus, in addition to implementing a two-port SRAM cell using forksheet transistors, it is possible to achieve reduction in the area of the semiconductor storage device.

Also, the nanosheets 21d and 21h are formed adjacent to the cell boundary on the right side in the figure, and the right side faces of the nanosheets 21d and 21h in the figure are exposed from the gate interconnects 31c and 31g, respectively. A two-port SRAM cell inverted in the X direction is placed on the right side of the two-port SRAM cell in FIGS. 1A-1B. That is, in the two-port SRAM cells arranged side by side in the X direction, the faces of the nanosheets 21d of these cells opposed to each other are exposed from the gate interconnects 31c, and the faces of the nanosheets 21h of these cells opposed to each other are exposed from the gate interconnects 31g. This can reduce the distance d1 between the read drive transistors RPD1 of these cells, and between the read access transistors RPG1 of these cells, in the X direction, whereby reduction in the area of the semiconductor storage device can be achieved.

While the width of the nanosheets 21a, 21c, 21d, 21e, 21g, and 21h in the X direction is illustrated to be double the width of the nanosheets 21b and 21f in the X direction, the size is not limited to this. The widths of the nanosheets 21a to 21h in the X direction (i.e., the gate widths of the transistors) may be determined considering the operational stability of the two-port SRAM cell circuit.

The shared contacts 61 and 62 may be formed in the same process step as, or in a different process step from, the contacts 82a to 82c for connecting the gate interconnects and the M1 interconnects.

Alteration 1

Figure 5:
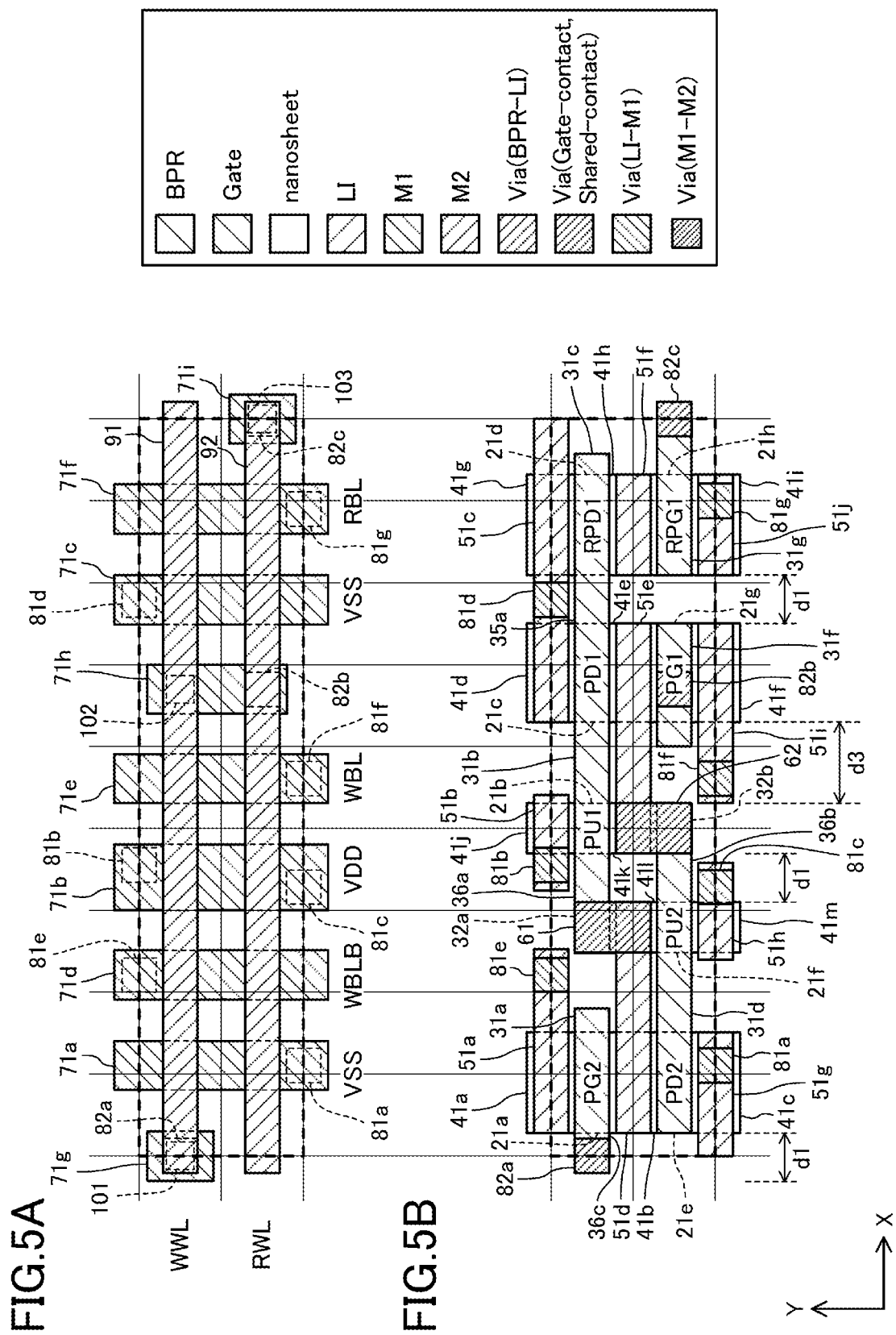
FIGS. 5A-5B are plan views showing another example of the layout structure of the two-port SRAM cell according to the first embodiment.

FIGS. 5A-5B are plan views showing another example of the layout structure of the two-port SRAM cell according to the first embodiment. Specifically, FIG. 5A shows an upper part of the cell, and FIG. 5B shows a lower part of the cell. In FIGS. 5A-5B, in comparison with FIGS. 1A-1B, the faces of the nanosheets opposite to the faces in the case of FIGS. 1A-1B in the X direction are exposed from the gate interconnects.

As shown in FIG. 5B, the nanosheets 21b are formed at an upper right position with respect to the nanosheets 21f in the figure as viewed in plan.

The gate interconnect 31b overlaps the nanosheets 21b and 21c as viewed in plan, and the gate interconnect 31c overlaps the nanosheets 21d as viewed in plan. The gate interconnect 31d overlaps the nanosheets 21e and 21f as viewed in plan. In FIGS. 5A-5B, the gate interconnect 31b is to be the gates of the load transistor PU1 and the drive transistor PD1, and the gate interconnect 31d is to be the gates of the drive transistor PD2 and the load transistor PU2.

A gate interconnect 32a extending in the X and Z directions are formed between the gate interconnects 31a and 31b. A gate interconnect 32b extending in the X and Z directions are formed between the gate interconnects 31d and 31f. The gate interconnect 32a is connected with the gate interconnect 31b through a bridge 36a, and also connected with the local interconnect 51d through the shared contact 61. The gate interconnect 32b is connected with the gate interconnect 31d through a bridge 36b, and also connected with the local interconnect 51e through the shared contact 62.

The gate interconnect 31a is connected with a gate interconnect 31a of a two-port SRAM cell placed adjacently on the left side of the subject two-port SRAM cell in the figure through a bridge 36c. The gate interconnect 31a is connected with the interconnect 71g through the bridge 36c and the contact 82a. The gate interconnect 31g is connected with the interconnect 71i through the contact 82c.

In FIGS. 5A-5B, the left side faces of the nanosheets 21a, 21b, 21d, 21e, and 21h are exposed, not covered with the gate interconnects 31a, 31b, 31c, 31d, and 31g, respectively. The right side faces of the nanosheets 21c, 21f, and 21g are exposed, not covered with the gate interconnects 31b, 31d, and 31f, respectively. That is, the faces of the nanosheets 21c and 21d opposed to each other are exposed from the gate interconnects 31b and 31c, respectively. The faces of the nanosheets 21g and 21h opposed to each other are exposed from the gate interconnects 31f and 31g, respectively. With this configuration, the distance d1 between the drive transistor PD1 and the read drive transistor RPD1, and between the access transistor PG1 and the read access transistor RPG1, in the X direction can be made smaller than a distance between other transistors adjacent to each other in the X direction (e.g., a distance d3 between the load transistor PU1 and the drive transistor PD1 in the X direction).

Also, the nanosheets 21a and 21e are formed adjacent to the cell boundary on the left side in the figure, and the left side faces of the nanosheets 21a and 21e are exposed from the gate interconnects 31a and 31d, respectively. A two-port SRAM cell inverted in the X direction is placed on the left side of the two-port SRAM cell in FIGS. 5A-5B. That is, in the two-port SRAM cells arranged side by side in the X direction, the faces of the nanosheets 21a of these cells opposed to each other are exposed from the gate interconnects 31a, and the faces of the nanosheets 21e of these cells opposed to each other are exposed from the gate interconnects 31d. With this configuration, the distance d1 between the access transistors PG2 of these cells, and between the drive transistors PD2 of these cells, in the X direction can be made smaller than a distance between other transistors adjacent to each other in the X direction (e.g., the distance d3 between the load transistor PU1 and the drive transistor PD1 in the X direction).

In the layout structure of FIGS. 5A-5B, the load transistors PU1 and PU2, the drive transistors PD1 and PD2, the access transistors PG1 and PG2, the read drive transistor RPD1, and the read access transistor RPG1 are each constituted by a forksheet transistor. In this way, a two-port SRAM cell using forksheet transistors is implemented.

Also, the nanosheets 21a to 21d are arranged in this order in the X direction, and the nanosheets 21e to 21h are arranged in this order in the X direction. The right side faces of the nanosheets 21c and 21g in the figure are exposed from the gate interconnects 31b and 31f, respectively. The left side faces of the nanosheets 21d and 21h in the figure are exposed from the gate interconnects 31c and 31g, respectively. That is, the faces of the nanosheets 21c and 21d opposed to each other are exposed from the gate interconnects 31b and 31c, respectively. The faces of the nanosheets 21g and 21h opposed to each other are exposed from the gate interconnects 31f and 31g, respectively. This can reduce the distance d1 between the drive transistor PD1 and the read drive transistor RPD1, and between the access transistor PG1 and the read access transistor RPG1, in the X direction, whereby reduction in the area of the semiconductor storage device can be achieved.

Therefore, with the layout structure of FIGS. 5A-5B, in addition to implementing a two-port SRAM cell using forksheet transistors, it is possible to achieve reduction in the area of the semiconductor storage device.

Also, the nanosheets 21b are formed at an upper right position with respect to the nanosheets 21f in the figure as viewed in plan. The left side faces of the nanosheets 21b in the figure are exposed from the gate interconnect 31b, and the right side faces of the nanosheets 21f in the figure are exposed from the gate interconnect 31d. That is, the faces of the nanosheets 21b and 21f opposed to each other in the X direction are exposed from the gate interconnects 31b and 31d, respectively. This can reduce the distance d1 between the load transistors PU1 and PU2 in the X direction, whereby reduction in the area of the semiconductor storage device can be achieved.

Also, the nanosheets 21a and 21e are formed adjacent to the cell boundary on the left side in the figure, and the left side faces of the nanosheets 21a and 21e are exposed from the gate interconnects 31a and 31d, respectively. A two-port SRAM cell inverted in the X direction is placed on the left side of the two-port SRAM cell in FIGS. 5A-5B. That is, in the two-port SRAM cells arranged side by side in the X direction, the faces of the nanosheets 21a of these cells opposed to each other are exposed from the gate interconnects 31a, and the faces of the nanosheets 21e of these cells opposed to each other are exposed from the gate interconnects 31d. This can reduce the distance d1 between the access transistors PG2 of these cells, and between the drive transistors PD2 of these cells, in the X direction, whereby reduction in the area of the semiconductor storage device can be achieved.

While the interconnect 71b supplying VDD and the interconnects 71a and 71c supplying VSS are formed in the M1 interconnect layer, the configuration is not limited to this.

Alteration 2

Figure 6:
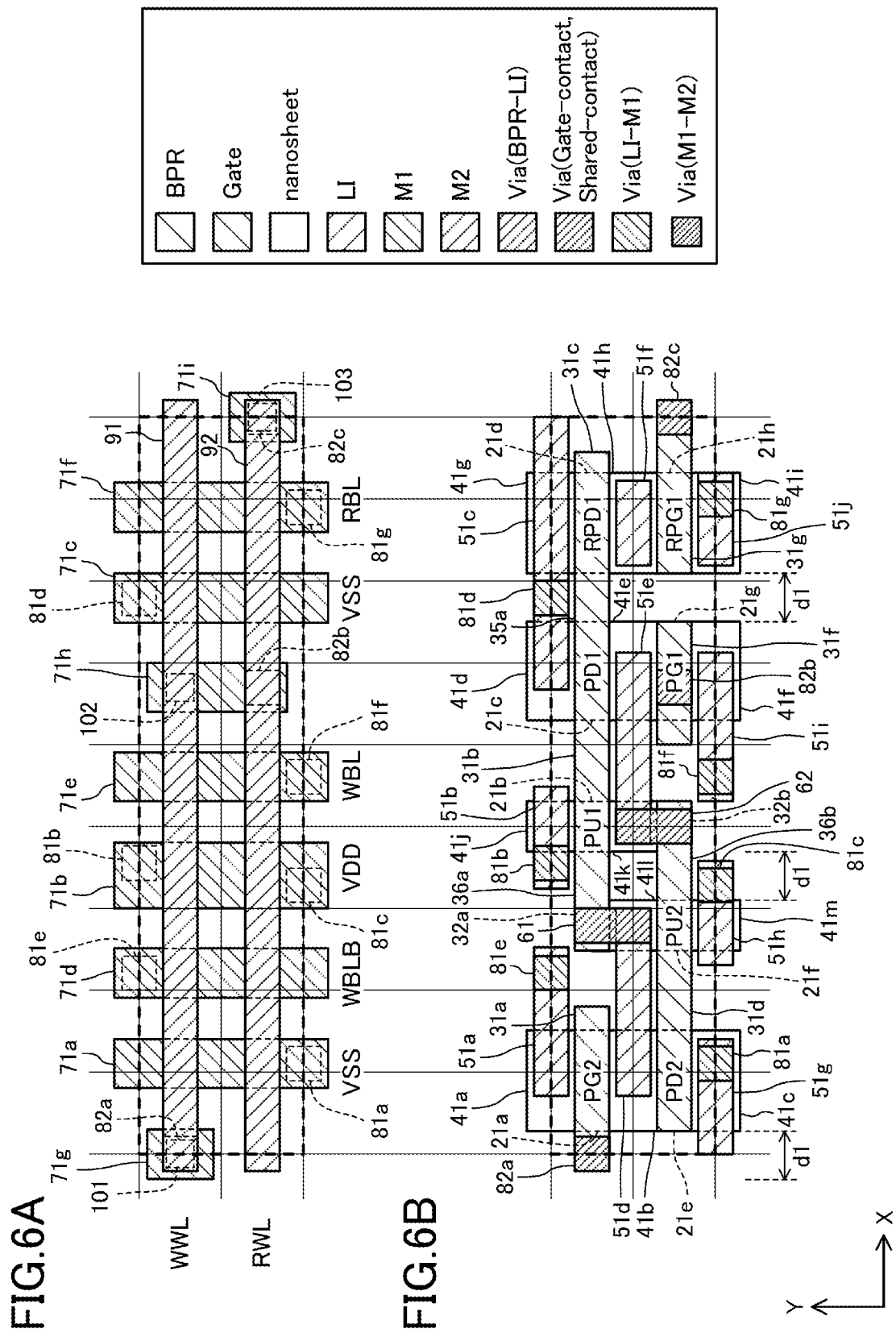
FIGS. 6A-6B are plan views showing yet another example of the layout structure of the two-port SRAM cell according to the first embodiment.

FIGS. 6A-6B are plan views showing yet another example of the layout structure of the two-port SRAM cell according to the first embodiment. Specifically, FIG. 6A shows an upper part of the cell, and FIG. 6B shows a lower part of the cell. In FIGS. 6A-6B, in comparison with FIGS. 5A-5B, some local interconnects are shorter in the X direction, and the shared contacts are narrower in the X direction.

For example, in FIG. 5B, the local interconnect 51a is formed so that its left end is aligned with the left end of the pad 41a in the figure. By contrast, in FIG. 6B, the local interconnect 51a is formed so that its left end is located near the center of the pad 41a in the X direction in the figure. In FIG. 6B, therefore, the length of the local interconnect 51a in the X direction is smaller than that in FIG. 5B. Similarly, other local interconnects are formed so that at least one of the two ends of each interconnect is located near the center of the corresponding pad, i.e., somewhere between the left and right ends of the pad, as viewed in the figure. As a result, in FIG. 6B, in some local interconnects, the length in the X direction is smaller than that in FIG. 5B.

Also, in FIG. 5B, the shared contact 61 is formed so that its left and right ends are aligned with the left and right ends of the pad 41l in the figure, and the shared contact 62 is formed so that its left and right ends are aligned with the left and right ends of the pad 41k in the figure. By contrast, in FIG. 6B, the shared contact 61 is formed so that its left end is located to the right of the left end of the pad 41l and its right end is located to the left of the right end of the pad 41l, as viewed in the figure. The shared contact 62 is formed so that its left end is located to the right of the left end of the pad 41k and its right end is located to the left of the right end of the pad 41k, as viewed in the figure. As a result, in FIG. 6B, the width of the shared contacts 61 and 62 in the X direction is smaller than that in FIG. 5B.

With the layout structure of FIGS. 6A-6B, similar effects to those obtained in FIGS. 5A-5B can be obtained.

Also, in FIGS. 6A-6B, compared with FIGS. 5A-5B, since some local interconnects (e.g., the local interconnect 51a) are shorter in the X direction, and the shared contacts 61 and 62 are narrower in the X direction, the parasitic capacitance in the semiconductor integrated circuit can be reduced, and thus speedup of the semiconductor storage device can be achieved. In addition, since the distance between the local interconnect and the shared contact can be widened, the processability improves, and also the yield can be improved.

While the interconnect 71b supplying VDD and the interconnects 71a and 71c supplying VSS are formed in the M1 interconnect layer as shown in FIG. 6A, the configuration is not limited to this. For example, some or all of interconnects supplying VDD and interconnects supplying VSS may be formed in a buried interconnect layer.

Note that, in FIGS. 1A-1B, also, some local interconnects (e.g., the local interconnect 51a) may be shortened in the X direction, and the shared contacts 61 and 62 may be narrowed in the X direction, as in FIGS. 6A-6B.

Alteration 3

Figure 7:
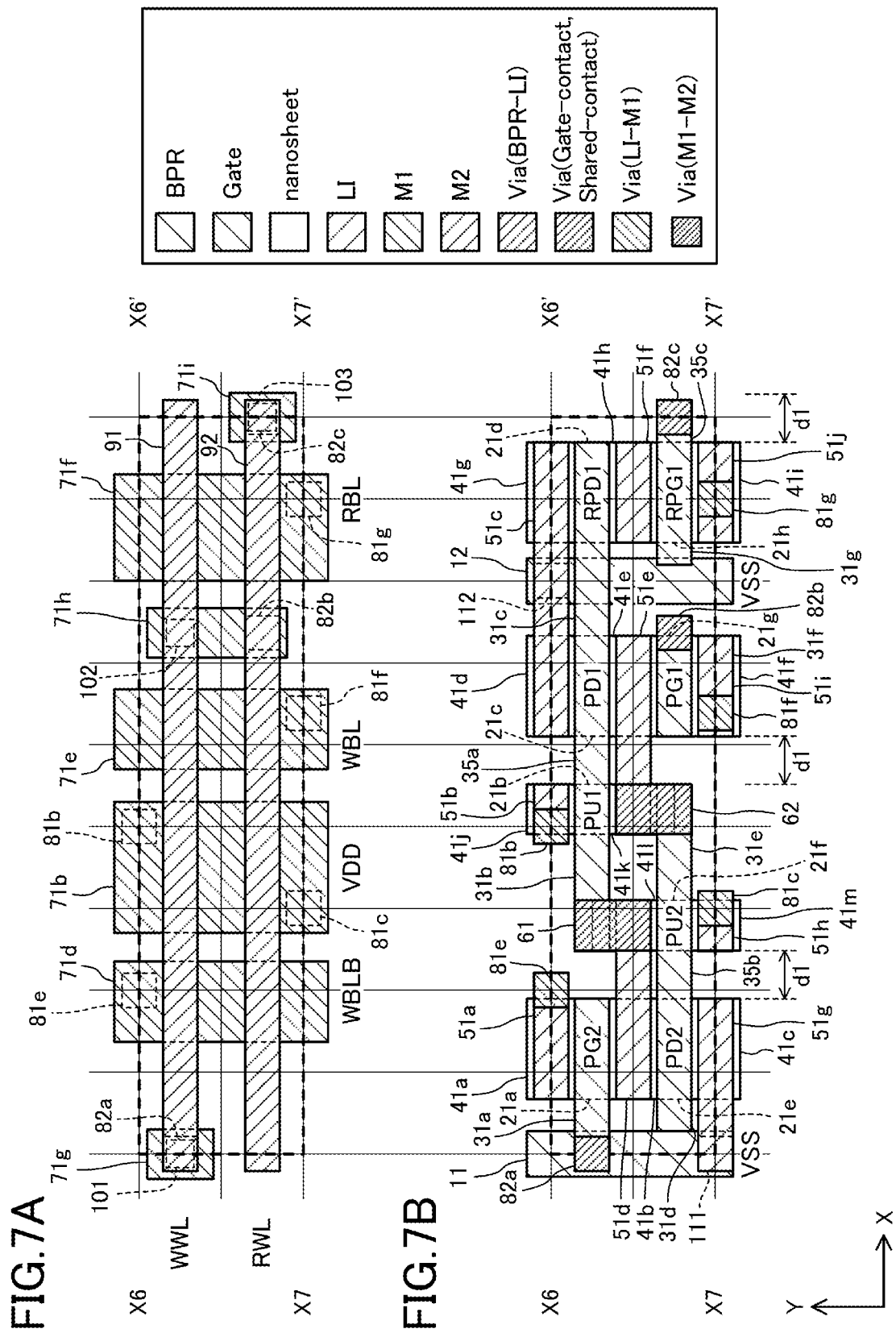
FIGS. 7A-7B are plan views showing still yet another example of the layout structure of the two-port SRAM cell according to the first embodiment.
Figure 8:
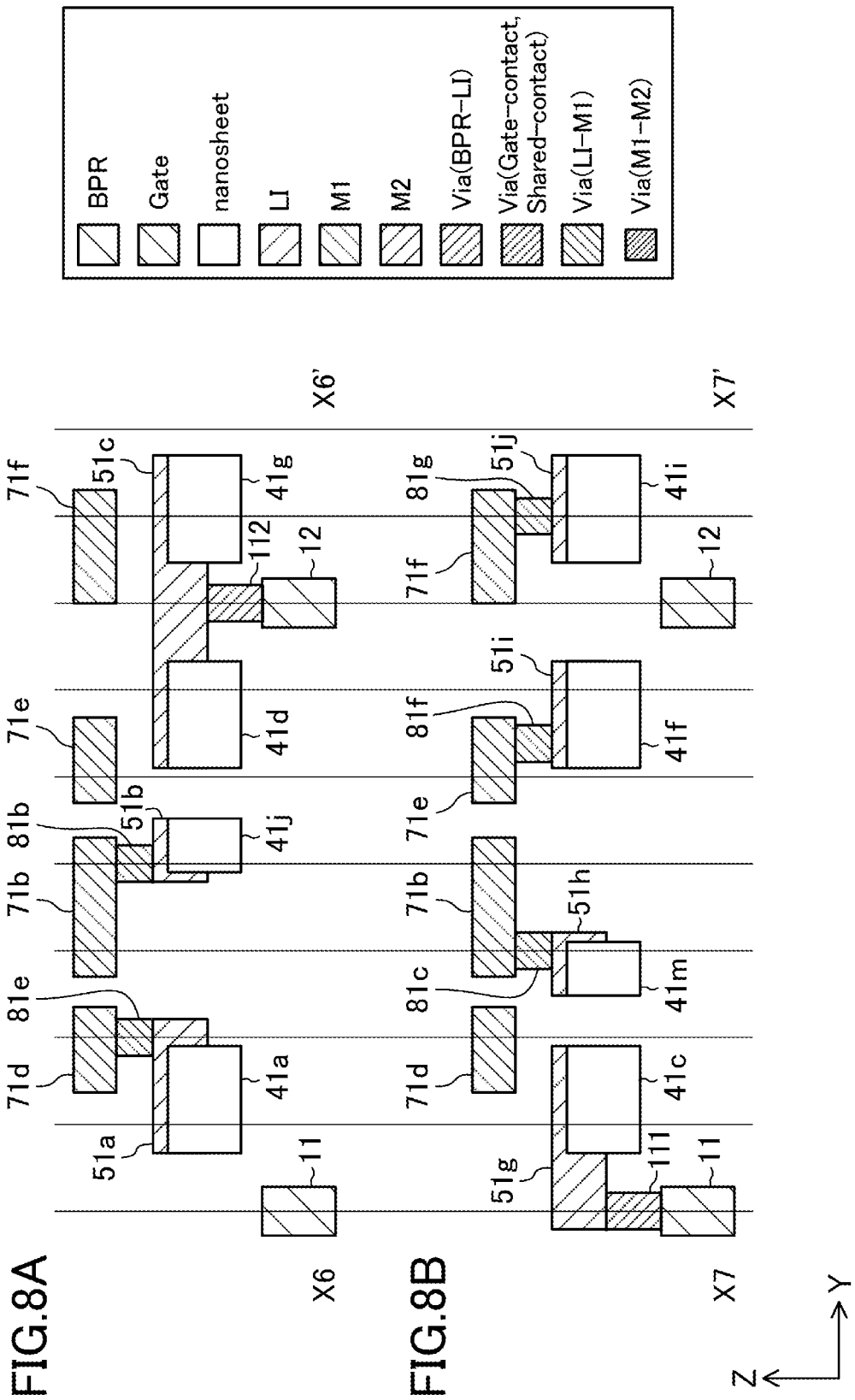
FIGS. 8A-8B are cross-sectional views showing the still yet another example of the layout structure of the two-port SRAM cell according to the first embodiment.

FIGS. 7A-7B are plan views, and FIGS. 8A-8B are cross-sectional views, showing yet another example of the layout structure of the two-port SRAM cell according to the first embodiment. Specifically, FIG. 7A shows an upper part of the cell, FIG. 7B shows a lower part of the cell, FIG. 8A shows a cross section taken along line X6-X6', and FIG. 8B shows a cross section taken along line X7-X7'. In FIGS. 7A-7B, in comparison with FIGS. 1A-1B, interconnects supplying VSS are formed in a buried interconnect layer, and the interconnects 71a and 71c formed in the M1 interconnect layer are omitted. Also, the interconnects 71d to 71f are widened in the X direction.

As shown in FIG. 7B, power lines 11 and 12 extending in the Y direction are formed across the cell from the upper to lower ends in the figure. The power lines 11 and 12 are both buried power rails (BPRs) formed in a buried interconnect layer, and supply VSS. The power line 11 is connected with the local interconnect 51g through a contact 111, and the power line 12 is connected with the local interconnect 51c through a contact 112.

As shown in FIG. 7A, in comparison with FIG. 1A, the widths of the interconnects 71d to 71f in the X direction are larger. The interconnects 71d to 71f are formed to be wider in the X direction than the interconnect 71h that is an interconnect narrowest in the X direction among the interconnects formed in the M1 interconnect layer.

With the layout structure of FIGS. 7A-7B, similar effects to those obtained in FIGS. 1A-1B can be obtained.

Also, since the power lines 11 and 12 supplying VSS are formed in the buried interconnect layer in FIGS. 7A-7B, the interconnects 71a and 71c formed in the M1 interconnect layer are unnecessary, so that the interconnects 71d to 71f (the write bit lines WBLB and WBL and the read bit line RBL) can be widened in the X direction. It is therefore possible to improve the write performance at the write through the interconnects 71d and 71e and the read performance at the read through the interconnect 71f in the semiconductor storage device.

While the widths of the interconnects 71d to 71f in the X direction are larger than the width of the interconnect 71h in the X direction in FIG. 7A, the configuration is not limited to this. It is only required for at least one of the interconnects 71d to 71f to be wider than the interconnect 71h in the X direction.

Second Embodiment

Figure 9:
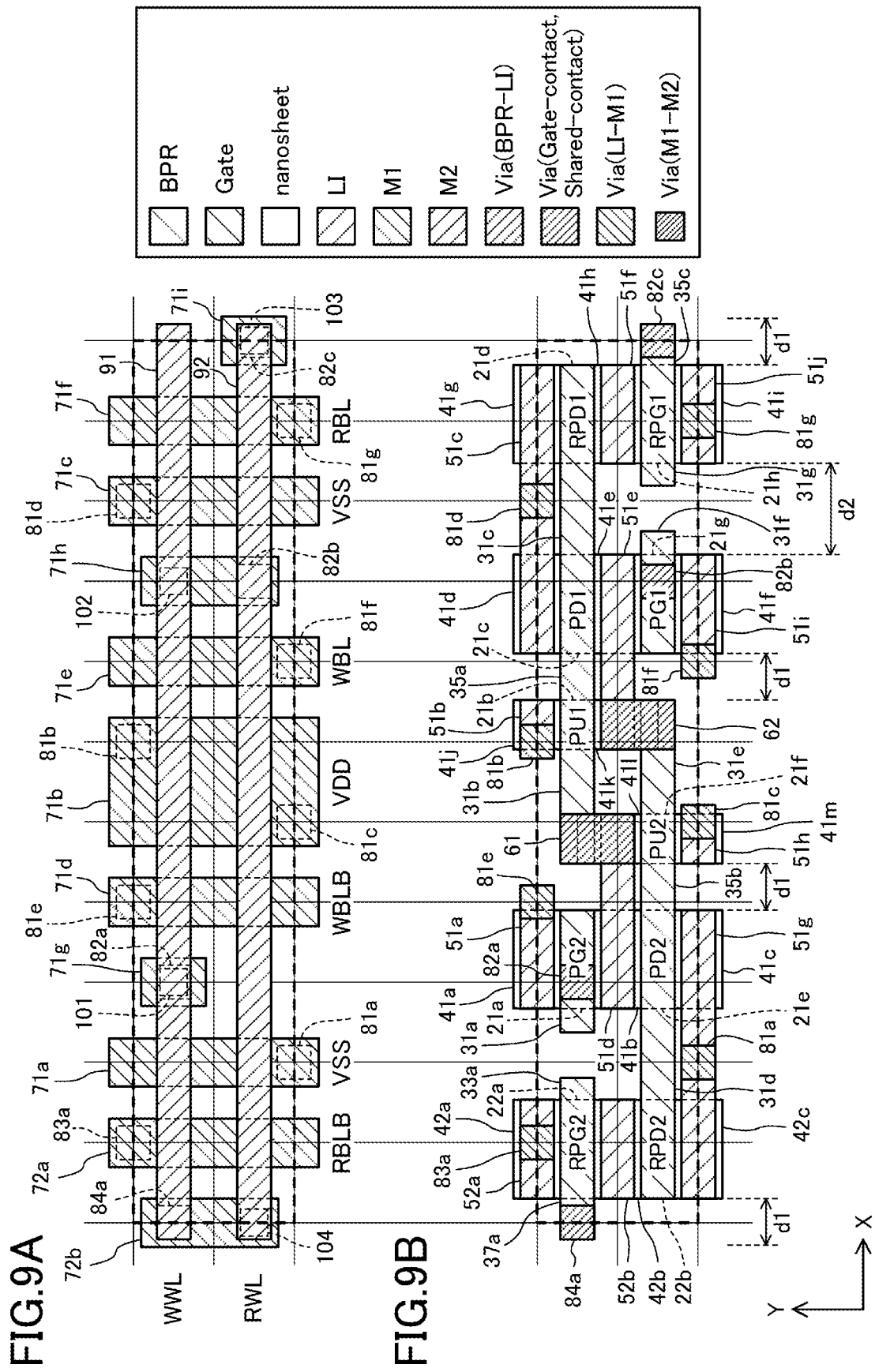
FIGS. 9A-9B are plan views showing an example of the layout structure of a two-port SRAM cell according to the second embodiment.
Figure 10:
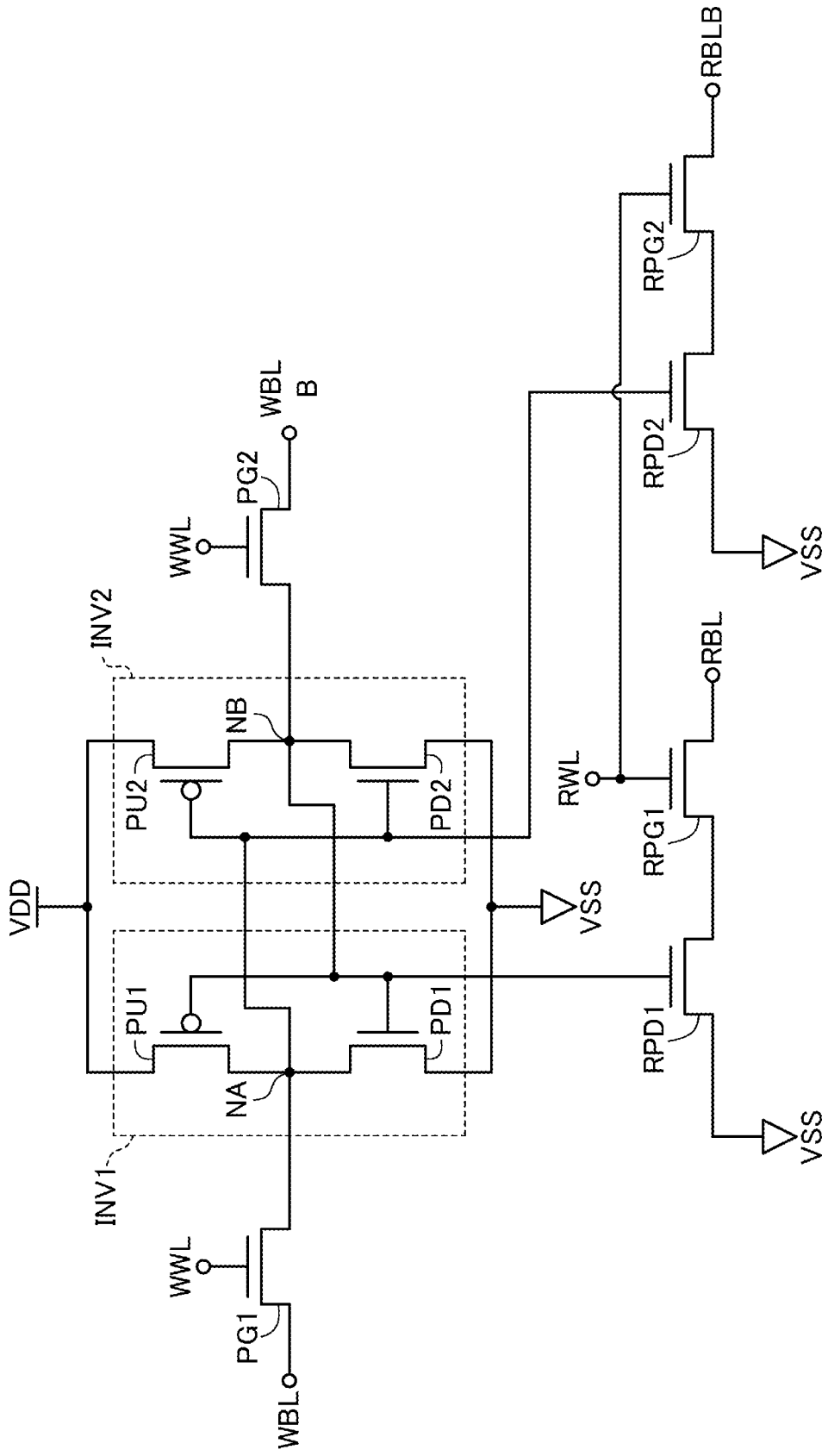
FIG. 10 is a circuit diagram showing a configuration of the two-port SRAM cell according to the second embodiment.

FIGS. 9A-9B are plan views showing an example of the layout structure of a two-port SRAM cell according to the second embodiment, and FIG. 10 is a circuit diagram configured in the two-port SRAM cell according to the second embodiment. Specifically, FIG. 9A shows an upper part of the cell, and FIG. 9B shows a lower part of the cell. Note that, in FIGS. 9A-9B and 10, the load transistors PU1 and PU2, the drive transistors PD1 and PD2, the access transistors PG1 and PG2, the read drive transistor RPD1, and the read access transistor RPG1 are constituted by the same nanosheets, pads, and gate interconnects as those in FIGS. 1A-1B.

As shown in FIG. 10, in the two-port SRAM cell according to the second embodiment, a two-port SRAM circuit is constituted by the load transistors PU1 and PU2, the drive transistors PD1 and PD2, the access transistors PG1 and PG2, the read drive transistor RPD1, the read access transistors RPG1, a read drive transistor RPD2, and a read access transistor RPG2. The read drive transistor RPD2 and the read access transistor RPG2 are n-type FETs.

The read drive transistor RPD2 is connected to VSS at its source and to the first node NA at its gate. The read access transistor RPG2 is connected to the drain of the read drive transistor RPD2 at its source, to a read bit line RBLB at its drain, and to the read word line RWL at its gate.

In the two-port SRAM circuit according to the second embodiment, when the read bit lines RBL and RBLB are precharged to HIGH level in advance and the read word line RWL is driven to HIGH level, the state of the read bit line RBL is established depending on the data written in the second node NB and the state of the read bit line RBLB is established depending on the data written in the first node NA, whereby read of data from the SRAM cell can be performed. Specifically, when the first node NA is in LOW level and the second node NB is in HIGH level, the read bit line RBL is discharged to LOW level and the read bit line RBLB retains HIGH level. By contrast, when the first node NA is in HIGH level and the second node NB is in LOW level, the read bit line RBL retains HIGH level and the read bit line RBLB is discharged to LOW level.

As shown in FIG. 9B, the read access transistor RPG2 and the read drive transistor RPD2 are formed on the left side of the access transistor PG2 and the drive transistor PD2, respectively.

Specifically, nanosheets 22a and 22b extending in the X and Z directions are formed adjacent to the cell boundary on the left side in the figure. The nanosheets 22a and 22b are formed on the left side of the nanosheets 21a and 21e, respectively, in the figure. The nanosheets 22a and 21a to 21d are formed in line in this order in the X direction, and the nanosheets 22b and 21e to 21h are formed in line in this order in the X direction. The nanosheets 22a and 22b are formed side by side in the Y direction.

The width of the nanosheets 22a and 22b in the X direction is double the width of the nanosheets 21b and 21f in the X direction.

The nanosheets 22a and 22b constitute the channel portions of the read access transistor RPG2 and the read drive transistor RPD2, respectively.

A gate interconnect 33a extending in the X and Z directions is formed on the left side of the gate interconnect 31a. The gate interconnects 33a and 31a to 31c are formed in line in the X direction.

The gate interconnect 33a overlaps the nanosheets 22a as viewed in plan, and the gate interconnect 31d overlaps the nanosheets 21e and 22b as viewed in plan.

The gate interconnect 33a is to be the gate of the read access transistor RPG2, and the gate interconnect 31d is to be the gate of the read drive transistor RPD2.

The gate interconnect 33a is connected with a gate interconnect 33a of a two-port SRAM cell placed on the left side of the subject two-port SRAM cell in the figure through a bridge 37a.

Pads 42a to 42c doped with an n-type semiconductor are formed at the upper end of the nanosheets 22a, between the nanosheets 22a and 22b, and at the lower end of the nanosheets 22b, respectively, as viewed in the figure. The pads 42a and 42b constitute the nodes of the read access transistor RPG2, and the pads 42b and 42c constitute the nodes of the read drive transistor RPD2.

That is, the read access transistor RPG2 is constituted by the nanosheets 22a, the gate interconnect 33a, and the pads 42a and 42b. The read drive transistor RPD2 is constituted by the nanosheets 22b, the gate interconnect 31d, and the pads 42b and 42c.

Thus, the read access transistor RPG2, the access transistor PG2, the load transistor PU1, the drive transistor PD1, and the read drive transistor RPD1 are formed in line in the X direction. The read drive transistor RPD2, the drive transistor PD2, the load transistor PU2, the access transistor PG1, and the read access transistor RPG1 are formed in line in the X direction. Also, the read access transistor PPG2 and the read drive transistor RPD2 are formed side by side in the Y direction.

With the above arrangement, in FIG. 9B, the transistors are placed symmetrically with respect to the center point of the cell. More specifically, the load transistors PU1 and PU2 are placed symmetrically with respect to the cell center point, the drive transistors PD1 and PD2 are placed symmetrically with respect to the cell center point, the access transistors PG1 and PG2 are placed symmetrically with respect to the cell center point, the read drive transistors RPD1 and RPD2 are placed symmetrically with respect to the cell center point, and the read access transistors RPG1 and RPG2 are placed symmetrically with respect to the cell center point.

In the local interconnect layer, local interconnects 52a and 52b extending in the X direction are formed on the left side of the local interconnects 51a and 51d, respectively, in the figure. The local interconnect 52a is connected with the pad 42a, and the local interconnect 52b is connected with the pad 42b. Also, the local interconnect 51g is connected with the pads 41c and 42c.

As shown in FIG. 9A, in the M1 interconnect layer, formed are an interconnect 72a extending in the Y direction across the cell from the upper to lower ends in the figure, and an interconnect 72b. The interconnect 72a corresponds to the read bit line RBLB. The interconnects 72a and 71f are placed symmetrically with respect to the center line of the cell in the X direction, and the interconnects 71d and 71e are placed symmetrically with respect to the cell center line in the X direction.

The interconnect 72a is connected with the local interconnect 52a through a contact 83a, and the interconnect 72b is connected with the gate interconnect 33a through a contact 84a and the bridge 37a, and also connected with the interconnect 92 through a contact 104.

The peripheries of the nanosheets 22a and 22b in the X and Z directions are surrounded by the gate interconnects. Note however that portions of the peripheries of the nanosheets 22a and 22b in the X and Z directions are exposed, not covered by the gate interconnects.

More specifically, the left side faces of the nanosheets 22a and 22b are exposed, not covered with the gate interconnects 33a and 31d, respectively. Also, the nanosheets 22a and 22b are placed adjacent to the cell boundary on the left side in the figure. A two-port SRAM cell inverted in the X direction is placed on the left side of the two-port SRAM cell in FIGS. 9A-9B. That is, in the two-port SRAM cells arranged side by side in the X direction, the faces of the nanosheets 22a of these cells opposed to each other are exposed from the gate interconnects 33a, and the faces of the nanosheets 22b of these cells opposed to each other are exposed from the gate interconnects 31d. With this configuration, the distance d1 between the read access transistors RPG2 of these cells, and between the read drive transistors RPD2 of these cells, in the X direction can be made smaller than a distance between other transistors adjacent to each other in the X direction (e.g., the distance d2 between the drive transistor PD1 and the read drive transistor RPD1 in the X direction).

Also, the right side faces of the nanosheets 21a, 21b, 21d, 21e, and 21h are exposed, not covered with the gate interconnects 31a, 31b, 31c, 31d, and 31g, respectively. The left side faces of the nanosheets 21c, 21f, and 21g are exposed, not covered with the gate interconnects 31c, 31e, and 31f, respectively.

With the above configuration, in the read drive transistor RPD2, the pad 42c is connected to the interconnect 71a supplying VSS and the gate interconnect 31d is connected to the shared contact 62 (the first node NA). In the read access transistor RPG2, the pad 42a is connected to the interconnect 72a (the read bit line RBLB) and the gate interconnect 33a is connected to the interconnect 92 (the read word line RWL). The read drive transistor RPD2 and the read access transistor RPG2 share the pad 42b. The nanosheets 22a and 22b are formed adjacent to the cell boundary on the left side in the figure. The peripheries of the nanosheets 22a and 22b in the X and Z directions are surrounded by the gate interconnects 33a and 31d, respectively, but the left side faces of the nanosheets 22a and 22b in the figure are exposed from the gate interconnects 33a and 31d.

That is, the load transistors PU1 and PU2, the drive transistors PD1 and PD2, the access transistors PG1 and PG2, the read drive transistors RPD1 and RPD2, and the read access transistors RPG1 and RPG2 are each constituted by a forksheet transistor. In this way, a two-port SRAM cell using forksheet transistors is implemented.

Also, the nanosheets 22a and 22b are formed adjacent to the cell boundary on the left side in the figure, and the left side faces thereof in the figure are exposed from the gate interconnects 33a and 31d, respectively. A two-port SRAM cell inverted in the X direction is placed on the left side of the two-port SRAM cell in FIGS. 9A-9B. That is, in the two-port SRAM cells arranged side by side in the X direction, the faces of the nanosheets 22a of these cells opposed to each other are exposed from the gate interconnects 33a, and the faces of the nanosheets 22b of these cells opposed to each other are exposed from the gate interconnects 31d. This can reduce the distance d1 between the read access transistors RPG2 of these cells, and between the read drive transistors RPD2 of these cells, in the X direction, whereby reduction in the area of the semiconductor storage device can be achieved.

Also, the load transistors PU1 and PU2 are placed symmetrically with respect to the cell center point, the drive transistors PD1 and PD2 are placed symmetrically with respect to the cell center point, the access transistors PG1 and PG2 are placed symmetrically with respect to the cell center point, the read drive transistors RPD1 and RPD2 are placed symmetrically with respect to the cell center point, and the read access transistors RPG1 and RPG2 are placed symmetrically with respect to the cell center point. This makes the characteristics of the write bit lines WBL and WBLB identical to each other, and the characteristics of the read bit lines RBL and RBLB identical to each other, whereby the operational stability and operating speed of the semiconductor storage device improve.

Also, in the M1 interconnect layer, the interconnects 72a and 71f are placed symmetrically with respect to the cell center line in the X direction, and the interconnects 71d and 71e are placed symmetrically with respect to the cell center line in the X direction. That is, the interconnects corresponding to the read bit lines RBL and RBLB are placed symmetrically with respect to the cell center line in the X direction, and the interconnects corresponding to the write bit lines WBL and WBLB are placed symmetrically with respect to the cell center line in the X direction. This also makes the characteristics of the write bit lines WBL and WBLB identical to each other, and the characteristics of the read bit lines RBL and RBLB identical to each other, whereby the operational stability and operating speed of the semiconductor storage device improve.

While the interconnect 71b supplying VDD and the interconnects 71a and 71c supplying VSS are formed in the M1 interconnect layer as shown in FIG. 9A, the configuration is not limited to this. For example, some or all of interconnects supplying VDD and interconnects supplying VSS may be formed in a buried interconnect layer.

Alteration 1

FIGS. 11A-11B are plan views showing another example of the layout structure of the two-port SRAM cell according to the second embodiment. Specifically, FIG. 11A shows an upper part of the cell, and FIG. 11B shows a lower part of the cell. In FIGS. 11A-11B, in comparison with FIGS. 9A-9B, the faces of the nanosheets opposite to the faces in the case of FIGS. 9A-9B in the X direction are exposed from the gate interconnects. Note that, in FIGS. 11A-11B, the load transistors PU1 and PU2, the drive transistors PD1 and PD2, the access transistors PG1 and PG2, the read drive transistor RPD1, and the read access transistor RPG1 are constituted by the same nanosheets, pads, and gate interconnects as those in FIGS. 5A-5B.

As shown in FIG. 11B, a gate interconnect 34a extending in the X and Z directions are formed on the left side of the gate interconnect 31d in the figure. The gate interconnect 34a overlaps the nanosheets 22b as viewed in plan, and connected with the gate interconnect 31d through a bridge 38a. The gate interconnect 34a is to be the gate of the read drive transistor RPD2.

The gate interconnect 33a is connected with the interconnect 72b through the contact 84a.

In FIGS. 11A-11B, the left side faces of the nanosheets 21a, 21b, 21d, 21e, and 21h are exposed, not covered with the gate interconnects 31a, 31b, 31c, 31d, and 31g, respectively. The right side faces of the nanosheets 21c, 21f, 21g, 22a, and 22b are exposed, not covered with the gate interconnects 31b, 31d, 31f, 33a, and 34a, respectively. That is, the faces of the nanosheets 21a and 22a opposed to each other are exposed from the gate interconnects 31a and 33a, respectively. The faces of the nanosheets 21e and 22b opposed to each other are exposed from the gate interconnects 31d and 34a, respectively. With this configuration, the distance d1 between the read access transistor RPG2 and the access transistor PG2, and between the read drive transistor RPD2 and the drive transistor PD2, in the X direction can be made smaller than a distance between other transistors adjacent to each other in the X direction (e.g., a distance d3 between the load transistor PU1 and the drive transistor PD1 in the X direction).

In the layout structure of FIGS. 11A-11B, the load transistors PU1 and PU2, the drive transistors PD1 and PD2, the access transistors PG1 and PG2, the read drive transistors RPD1 and RPD2, and the read access transistors RPG1 and RPG2 are each constituted by a forksheet transistor. In this way, a two-port SRAM cell using forksheet transistors is implemented.

Also, the nanosheets 22a and 21a to 21d are arranged in this order in the X direction, and the nanosheets 22b and 21e to 21h are arranged in this order in the X direction. The right side faces of the nanosheets 22a and 22b are exposed from the gate interconnects 33a and 34a, respectively, and the left side faces of the nanosheets 21a and 21e are exposed from the gate interconnects 31a and 31d, respectively. That is, the faces of the nanosheets 21a and 22a opposed to each other are exposed from the gate interconnects 31a and 33a, respectively, and the faces of the nanosheets 21e and 22b opposed to each other are exposed from the gate interconnects 31d and 34a, respectively. This can reduce the distance d1 between the read access transistor RPG2 and the access transistor PG2, and between the read drive transistor RPD2 and the drive transistor PD2, in the X direction, whereby reduction in the area of the semiconductor storage device can be achieved.

Therefore, with the layout structure of FIGS. 11A-11B, in addition to implementing a two-port SRAM cell using forksheet transistors, it is possible to achieve reduction in the area of the semiconductor storage device.

Alteration 2

FIGS. 12A-12B are plan views showing yet another example of the layout structure of the two-port SRAM cell according to the second embodiment. Specifically, FIG. 12A shows an upper part of the cell, and FIG. 12B shows a lower part of the cell. In FIGS. 12A-12B, in comparison with FIGS. 11A-11B, some local interconnects are shorter in the X direction, and the shared contacts are narrower in the X direction.

For example, in FIG. 11B, the local interconnect 51a is formed so that its left end is aligned with the left end of the pad 41a in the figure. By contrast, in FIG. 12B, the local interconnect 51a is formed so that its left end is located near the center of the pad 41a in the X direction in the figure. In FIG. 12B, therefore, the length of the local interconnect 51a in the X direction is smaller than that in FIG. 11B. Similarly, other local interconnects are formed so that at least one of the two ends of each interconnect is located near the center of the corresponding pad, i.e., somewhere between the left and right ends of the pad, as viewed in the figure. As a result, in FIG. 12B, in some local interconnects, the length in the X direction is smaller than that in FIG. 11B.

Also, in FIG. 11B, the shared contact 61 is formed so that its left and right ends are aligned with the left and right ends of the pad 41l in the figure, and the shared contact 62 is formed so that its left and right ends are aligned with the left and right ends of the pad 41k in the figure. By contrast, in FIG. 12B, the shared contact 61 is formed so that its left end is located to the right of the left end of the pad 41l and its right end is located to the left of the right end of the pad 41l, as viewed in the figure. The shared contact 62 is formed so that its left end is located to the right of the left end of the pad 41k and its right end is located to the left of the right end of the pad 41k, as viewed in the figure. As a result, in FIG. 12B, the width of the shared contacts 61 and 62 in the X direction is smaller than that in FIG. 11B.

With the layout structure of FIGS. 12A-12B, similar effects to those obtained in FIGS. 11A-11B can be obtained.

Also, in FIGS. 12A-12B, compared with FIGS. 11A-11B, since some local interconnects (e.g., the local interconnect 51a) are shorter in the X direction, and the shared contacts 61 and 62 are narrower in the X direction, the parasitic capacitance in the semiconductor integrated circuit can be reduced, and thus speedup of the semiconductor storage device can be achieved.

While the interconnect 71b supplying VDD and the interconnects 71a and 71c supplying VSS are formed in the M1 interconnect layer as shown in FIG. 12A, the configuration is not limited to this. For example, some or all of interconnects supplying VDD and interconnects supplying VSS may be formed in a buried interconnect layer.

Note that, in FIGS. 9A-9B, also, some local interconnects (e.g., the local interconnect 51a) may be shortened in the X direction, and the shared contacts 61 and 62 may be narrowed in the X direction, as in FIGS. 12A-12B.

Alteration 3

FIGS. 13A-13B are plan views showing yet another example of the layout structure of the two-port SRAM cell according to the second embodiment. Specifically, FIG. 13A shows an upper part of the cell, and FIG. 13B shows a lower part of the cell. In FIGS. 13A-13B, in comparison with FIGS. 12A-12B, interconnects supplying VSS are formed in a buried interconnect layer, and the interconnects 71a and 71c formed in the M1 interconnect layer are omitted.

As shown in FIG. 13B, power lines 11 and 12 extending in the Y direction are formed across the cell from the upper to lower ends in the figure. The power lines 11 and 12 are both buried power rails (BPRs) formed in a buried interconnect layer, and supply VSS. The power line 11 is connected with the local interconnect 51g through a contact 111, and the power line 12 is connected with the local interconnect 51c through a contact 112.

With the layout structure of FIGS. 13A-13B, similar effects to those obtained in FIGS. 12A-12B can be obtained.

In the embodiments and alterations described above, while each transistor includes three nanosheets, some or all transistors may include one nanosheet, two nanosheets, or four or more nanosheets.

While the cross-sectional shape of the nanosheets is illustrated as rectangular in the above embodiments, it is not limited to this. For example, the shape may be square, circular, or oval.

According to the present disclosure, a two-port SRAM cell using forksheet transistors can be implemented, and also reduction in the area of a semiconductor storage device can be achieved.

What is claimed is:
1. A semiconductor storage device including a two-port SRAM cell, the two-port SRAM cell comprising:
    a first transistor connected to a first power supply supplying a first voltage at one of its nodes, to a first node at the other node, and to a second node at its gate;
    a second transistor connected to the first power supply at one of its nodes, to the second node at the other node, and to the first node at its gate;
    a third transistor connected to the first node at one of its nodes, to a second power supply supplying a second voltage different from the first voltage at the other node, and to the second node at its gate;

a fourth transistor connected to the second node at one of its nodes, to the second power supply at the other node, and to the first node at its gate;
a fifth transistor connected to a first write bit line at one of its nodes, to the first node at the other node, and to a write word line at its gate;
a sixth transistor connected to a second write bit line at one of its nodes, to the second node at the other node, and to the write word line at its gate, the first write bit line and the second write bit line constituting a complementary bit line pair;
a seventh transistor connected to the second power supply at one of its nodes and to the second node at its gate; and
an eighth transistor connected to the other node of the seventh transistor at one of its nodes, to a first read bit line at the other node, and to a read word line at its gate, wherein
the first to eighth transistors respectively include
first to eighth nanosheets extending in a first direction, and
first to eighth gate interconnects surrounding the first to eighth nanosheets in a second direction vertical to the first direction and in a third direction perpendicular to the first and second directions,
the sixth, first, third, and seventh nanosheets are formed in line in this order in the second direction,
the fourth, second, fifth, and eighth nanosheets are formed in line in this order in the second direction,
faces of the second, third, and fifth nanosheets on a first side as one of the opposite sides in the second direction are exposed from the second, third, and fifth gate interconnects, respectively,
faces of the first, fourth, sixth, seventh, and eighth nanosheets on a second side as the other side in the second direction are exposed from the first, fourth, sixth, seventh, and eighth gate interconnects, respectively,
the first side is the side on which the third nanosheet is opposed to the first nanosheet, and also the side on which the second nanosheet is opposed to the fourth nanosheet, and
the second side is the side on which the first nanosheet is opposed to the third nanosheet, and also the side on which the fourth nanosheet is opposed to the second nanosheet.

2. The semiconductor storage device of claim 1, wherein the third, sixth, and seventh nanosheets are formed side by side in the first direction with the fifth, fourth, and eighth nanosheets, respectively.

3. The semiconductor storage device of claim 1, wherein the seventh and eighth nanosheets are formed adjacent to a cell boundary of the two-port SRAM cell on the second side.

4. The semiconductor storage device of claim 1, wherein the two-port SRAM cell further comprises:
a power line extending in the first direction and supplying the second voltage;
a first interconnect extending in the first direction, which is to be the first write bit line;
a second interconnect extending in the first direction, which is to be the second write bit line; and
a third interconnect extending in the first direction, which is to be the first read bit line,
the power line is formed below the first to eighth transistors,
the first to third interconnects are formed in a same interconnect layer above the first to eighth transistors, and
at least one of the first to third interconnects is wider in the second direction than an interconnect narrowest in the second direction among interconnects formed in the interconnect layer.

5. The semiconductor storage device of claim 1, wherein the two-port SRAM cell further comprises:
a ninth transistor connected to the second power supply at one of its nodes and to the first node at its gate; and
a tenth transistor connected to the other node of the ninth transistor at one of its nodes, to a second read bit line at the other node, and to the read word line at its gate, the first read bit line and the second read bit line constituting a complementary bit line pair,
the ninth and tenth transistors respectively include
ninth and tenth nanosheets extending in the first direction, and
ninth and tenth gate interconnects surrounding the ninth and tenth nanosheets in the second and third directions,
the tenth, sixth, first, third, and seventh nanosheets are formed in line in this order in the second direction,
the ninth, fourth, second, fifth, and eighth nanosheets are formed in line in this order in the second direction, and
the ninth and tenth nanosheets are formed adjacent to a cell boundary of the two-port SRAM cell on the first side, and faces of the ninth and tenth nanosheets on the first side are exposed from the ninth and tenth gate interconnects, respectively.

6. The semiconductor storage device of claim 5, wherein the ninth and tenth nanosheets are formed side by side in the first direction.

7. The semiconductor storage device of claim 5, wherein the first and second transistors are placed symmetrically with respect to a center point of the two-port SRAM cell as viewed in plan,
the third and fourth transistors are placed symmetrically with respect to the center point of the two-port SRAM cell as viewed in plan,
the fifth and sixth transistors are placed symmetrically with respect to the center point of the two-port SRAM cell as viewed in plan,
the seventh and ninth transistors are placed symmetrically with respect to the center point of the two-port SRAM cell as viewed in plan, and
the eighth and tenth transistors are placed symmetrically with respect to the center point of the two-port SRAM cell as viewed in plan.

8. The semiconductor storage device of claim 5, wherein the two-port SRAM cell further comprises:
a first interconnect extending in the first direction, which is to be the first write bit line;
a second interconnect extending in the first direction, which is to be the second write bit line;
a third interconnect extending in the first direction, which is to be the first read bit line; and
a fourth interconnect extending in the first direction, which is to be the second read bit line,
the first and second interconnects are formed symmetrically with respect to a center line in the second direction in the two-port SRAM cell as viewed in plan, and
the third and fourth interconnects are formed symmetrically with respect to the center line in the second direction in the two-port SRAM cell as viewed in plan.

9. A semiconductor storage device including a two-port SRAM cells, the two-port SRAM cell comprising:
- a first transistor connected to a first power supply supplying a first voltage at one of its nodes, to a first node at the other node, and to a second node at its gate;
- a second transistor connected to the first power supply at one of its nodes, to the second node at the other node, and to the first node at its gate;
- a third transistor connected to the first node at one of its nodes, to a second power supply supplying a second voltage different from the first voltage at the other node, and to the second node at its gate;
- a fourth transistor connected to the second node at one of its nodes, to the second power supply at the other node, and to the first node at its gate;
- a fifth transistor connected to a first write bit line at one of its nodes, to the first node at the other node, and to a write word line at its gate;
- a sixth transistor connected to a second write bit line at one of its nodes, to the second node at the other node, and to the write word line at its gate, the first write bit line and the second write bit line constituting a complementary bit line pair;
- a seventh transistor connected to the second power supply at one of its nodes and to the second node at its gate; and
- an eighth transistor connected to the other node of the seventh transistor at one of its nodes, to a first read bit line at the other node, and to a read word line at its gate, wherein the first to eighth transistors respectively include
- first to eighth nanosheets extending in a first direction, and
- first to eighth gate interconnects surrounding the first to eighth nanosheets in a second direction vertical to the first direction and in a third direction perpendicular to the first and second directions, the sixth, first, third, and seventh nanosheets are formed in line in this order in the second direction, the fourth, second, fifth, and eighth nanosheets are formed in line in this order in the second direction, faces of the second, third, and fifth nanosheets on a first side as one of the opposite sides in the second direction are exposed from the second, third, and fifth gate interconnects, respectively, faces of the first, fourth, sixth, seventh, and eighth nanosheets on a second side as the other side in the second direction are exposed from the first, fourth, sixth, seventh, and eighth gate interconnects, respectively, the first side is the side on which the third nanosheet is opposed to the seventh nanosheet, and also the side on which the fifth nanosheet is opposed to the eighth nanosheet, and the second side is the side on which the seventh nanosheet is opposed to the third nanosheet, and also the side on which the eighth nanosheet is opposed to the fifth nanosheet.

10. The semiconductor storage device of claim 9, wherein the first nanosheet is formed on the first side of the second nanosheet as viewed in plan.

11. The semiconductor storage device of claim 9, wherein the third, sixth, and seventh nanosheets are formed side by side in the first direction with the fifth, fourth, and eighth nanosheets, respectively.

12. The semiconductor storage device of claim 9, wherein the seventh and eighth nanosheets are formed adjacent to a cell boundary of the two-port SRAM cell on the first side.

13. The semiconductor storage device of claim 9, wherein the two-port SRAM cell comprises local interconnects extending in the second direction, each connected to one of the nodes of each of the first to eighth transistors, and
one end of the local interconnect is located between the ends of the connected node in the second direction.

14. The semiconductor storage device of claim 9, wherein the two-port SRAM cell further comprises:
- a ninth transistor connected to the second power supply at one of its nodes and to the first node at its gate; and
- a tenth transistor connected to the other node of the ninth transistor at one of its nodes, to a second read bit line at the other node, and to the read word line at its gate, the first read bit line and the second read bit line constituting a complementary bit line pair, the ninth and tenth transistors respectively include
- ninth and tenth nanosheets extending in the first direction, and
- ninth and tenth gate interconnects surrounding the ninth and tenth nanosheets in the second and third directions, the tenth, sixth, first, third, and seventh nanosheets are formed in line in this order in the second direction, the ninth, fourth, second, fifth, and eighth nanosheets are formed in line in this order in the second direction, the first side is the side on which the ninth nanosheet is opposed to the fourth nanosheet, and also the side on which the tenth nanosheet is opposed to the sixth nanosheet, and the second side is the side on which the fourth nanosheet is opposed to the ninth nanosheet, and also the side on which the sixth nanosheet is opposed to the tenth nanosheet.

15. The semiconductor storage device of claim 14, wherein
the first and second transistors are placed symmetrically with respect to a center point of the two-port SRAM cell as viewed in plan,
the third and fourth transistors are placed symmetrically with respect to the center point of the two-port SRAM cell as viewed in plan,
the fifth and sixth transistors are placed symmetrically with respect to the center point of the two-port SRAM cell as viewed in plan,
the seventh and ninth transistors are placed symmetrically with respect to the center point of the two-port SRAM cell as viewed in plan, and
the eighth and tenth transistors are placed symmetrically with respect to the center point of the two-port SRAM cell as viewed in plan.

16. The semiconductor storage device of claim 14, wherein
the two-port SRAM cell further comprises:
- a first interconnect extending in the first direction, which is to be the first write bit line;
- a second interconnect extending in the first direction, which is to be the second write bit line;
- a third interconnect extending in the first direction, which is to be the first read bit line; and
- a fourth interconnect extending in the first direction, which is to be the second read bit line, the first and second interconnects are formed symmetrically with respect to a center line in the second direction in the two-port SRAM cell as viewed in plan, and the third and fourth interconnects are formed symmetrically with respect to the center line in the second direction in the two-port SRAM cell as viewed in plan.

17. The semiconductor storage device of claim 14, wherein the ninth and tenth nanosheets are formed side by side in the first direction.

18. The semiconductor storage device of claim 14, wherein the two-port SRAM cell comprises local interconnects extending in the second direction, each connected to one of the nodes of each of the first to tenth transistors, and one end of the local interconnect is located between the ends of the connected node in the second direction.

19. The semiconductor storage device of claim 14, wherein the two-port SRAM cell further comprises:

a power line extending in the first direction and supplying the second voltage;

a first interconnect extending in the first direction, which is to be the first write bit line;

a second interconnect extending in the first direction, which is to be the second write bit line; and a third interconnect extending in the first direction, which is to be the first read bit line, the power line is formed below the first to tenth transistors, and the first to third interconnects are formed in a same interconnect layer above the first to tenth transistor.

* * * * *